(12) United States Patent
Choi

(10) Patent No.: US 9,214,245 B2
(45) Date of Patent: Dec. 15, 2015

(54) E-FUSE STRUCTURE OF SEMICONDUCTOR DEVICE

(71) Applicant: Hyun-Min Choi, Uiwang-si (KR)

(72) Inventor: Hyun-Min Choi, Uiwang-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/559,846

(22) Filed: Dec. 3, 2014

(65) Prior Publication Data

US 2015/0206603 A1 Jul. 23, 2015

Related U.S. Application Data

(60) Provisional application No. 61/930,625, filed on Jan. 23, 2014.

(30) Foreign Application Priority Data

Mar. 19, 2014 (KR) .................. 10-2014-0032226

(51) Int. Cl.
*H01L 23/525* (2006.01)
*G11C 29/00* (2006.01)

(52) U.S. Cl.
CPC .......... *G11C 29/785* (2013.01); *H01L 23/5256* (2013.01)

(58) Field of Classification Search
CPC ................... H01L 23/525; H01L 23/53228
USPC ................................................ 257/529
See application file for complete search history.

(56) References Cited

U.S. PATENT DOCUMENTS

| 7,651,893 | B2 | 1/2010 | Chen et al. |
| 7,732,892 | B2 | 6/2010 | Jeng et al. |
| 7,835,211 | B2 | 11/2010 | Ueda |
| 8,268,679 | B2 | 9/2012 | Aubel et al. |
| 8,299,570 | B2 | 10/2012 | Kim et al. |
| 8,421,186 | B2 * | 4/2013 | Li et al. .......... 257/529 |
| 8,507,326 | B2 | 8/2013 | Kurz et al. |
| 2008/0308900 | A1 | 12/2008 | Kim et al. |
| 2009/0179302 | A1 | 7/2009 | Kothandaraman et al. |
| 2011/0156856 | A1 | 6/2011 | Hwang et al. |
| 2011/0241162 | A1 | 10/2011 | Kurz et al. |
| 2012/0154102 | A1 | 6/2012 | Chen |
| 2012/0249159 | A1 | 10/2012 | Filippi et al. |
| 2013/0127584 | A1 | 5/2013 | Filippi et al. |

FOREIGN PATENT DOCUMENTS

KR 10-1145383 5/2012

* cited by examiner

*Primary Examiner* — Marc Armand
(74) *Attorney, Agent, or Firm* — Muir Patent Law, PLLC

(57) ABSTRACT

Provided is an e-fuse structure of a semiconductor device having improved fusing performance so as to enable a program operation at a low voltage. The e-fuse structure includes a first metal pattern formed at a first vertical level, the first metal pattern including a first part extending in a first direction and a second part extending in the first direction and positioned to be adjacent to the first part, and a third part adjacent to the second part, the second part being positioned between the first part and the third part, the first part and the second part being electrically connected to each other, and the third part being electrically disconnected from the second part; and a second metal pattern electrically connected to the first metal pattern and formed at a second vertical level different from the first vertical level.

34 Claims, 35 Drawing Sheets

E-FUSE STRUCTURE OF SEMICONDUCTOR DEVICE

CROSS-REFERENCE TO RELATED APPLICATION

This application claims priority from Korean Patent Application No. 10-2014-0032226 filed on Mar. 19, 2014 in the Korean Intellectual Property Office, and all the benefits accruing therefrom under 35 U.S.C. 119, and also claims priority from U.S. Provisional Patent Application No. 61/930,625, filed Jan. 23, 2014, and all the benefits accruing therefrom under 35 U.S.C. 119, the contents of each of which in their entirety are herein incorporated by reference.

BACKGROUND

1. Field of the Invention

The present disclosure relates to an e-fuse structure, and more particularly to an e-fuse structure of a semiconductor device.

2. Description of the Related Art

In semiconductor device technologies, fuses are used for a variety of purposes. For example, to improve chip yield, fuses of memory devices are typically used in a repair process in which a bad (defective) memory cell is replaced with a redundancy memory cell. As other examples, fuses may be used to customize and/or optimize chip characteristics after fab-out, and fuses may be used to record/identify chip information and/or fabrication histories.

Fuses may be classified as either laser fuses or e-fuses. Laser fuses are configured to be selectively programmed (that is, opened) by utilization of a laser, and e-fuses are configured to be selectively programmed by utilization of electric current.

SUMMARY

The present disclosure provides an e-fuse structure of a semiconductor device having improved fusing performance so as to enable a program operation at a low voltage.

The above and other objectives of the present disclosure will be described in or be apparent from the following description of the various embodiments.

According to one aspect of the present invention a semiconductor device including an e-fuse structure includes a substrate; a first metal pattern formed at a first vertical level above the substrate; a second metal pattern formed at a second vertical level above the substrate closer to the substrate than the first vertical level; and a conductive via structure physically and electrically connecting the first metal pattern to the second metal pattern. The first metal pattern includes a first part extending in a first direction, a second part extending in the first direction and adjacent to the first part, a third part electrically and physically connecting the first part to the second part, and a fourth part extending in the first direction and adjacent to the second part but not electrically connected to the first, second, or third parts, and the second part is between the first part and the fourth part.

In one embodiment, the first part, second part, and fourth part are all substantially parallel to each other.

In one embodiment, the conductive via structure directly connects the first part to the second metal pattern.

In one embodiment, the second part is configured to break before the first part. For example, the second part has a smaller width in a direction perpendicular to the first direction than the first part.

In one embodiment, the first metal pattern is connected to a cathode of the e-fuse structure, and the second metal pattern is connected to an anode of the e-fuse structure.

In one embodiment, the first part, second part, third part, and fourth part are all integrally formed at the first level.

According to another aspect of the present invention, there is provided an e-fuse structure of a semiconductor device, comprising a first metal pattern formed at a first vertical level, the first metal pattern including a first part extending in a first direction and a second part extending in the first direction and positioned to be adjacent to the first part, and a third part adjacent to the second part, the second part being positioned between the first part and the third part, the first part and the second part being electrically connected to each other, and the third part being electrically disconnected from the second part; and a second metal pattern electrically connected to the first metal pattern and formed at a second vertical level different from the first vertical level.

The first metal pattern may include a fourth part electrically and physically connecting the first part to the second part.

In one embodiment, the first part, the fourth part and the second part are sequentially connected to one another form a U-shape configuration.

A width of the fourth part between an inside side surface of the U-shape and an outside side surface of the U-shape may be greater than a width of the first part between the inside side surface of the U-shape the outside side surface of the U-shape.

The width of the second part may be a critical dimension L and the width of the fourth part may be greater than L and smaller than or equal to 2L.

In one embodiment, the first metal pattern includes a fourth part extending in the first direction and having a side surface facing a side surface of the second part, and the first part is positioned between the second part and the fourth part.

The first metal pattern may include a fifth part connecting the second part to the fourth part.

The second part, the fifth part and the fourth part may be sequentially connected to one another form a U-shaped configuration.

In one embodiment, the first part, second part, third part, fourth part, and fifth part form an integrally formed spiral structure.

In one embodiment, the fourth part is not used as a path of current migration.

In one embodiment, the e-fuse structure may further comprise a via connecting the first metal pattern to the second metal pattern, and the second metal pattern includes a fourth part and a fifth part having side surfaces facing each other and positioned to be adjacent to each other and a sixth part connecting one end of the fourth part to one end of the fifth part, and the via directly connects the first part to the fourth part.

A width of the fourth part may be greater than that of the first part and the width of the first part is greater than that of the second part.

The second metal pattern may further include a seventh part facing the sixth part with the fourth part and the fifth part positioned between the sixth part and the seventh part.

The seventh part may be connected to the other end of the fifth part opposite to one end of the fifth part.

In one embodiment, the second metal pattern further includes an eighth part connected to the seventh part, and the seventh part and the eighth part connected to each other are L-shaped.

In one embodiment, the seventh part is not used as a path of current migration.

In one embodiment, the first metal pattern includes a first power supply connection part connected to the second part and the second metal pattern includes a second power supply connection part connected to the fifth part.

In one embodiment, the fifth part extends in a second direction different from the first direction, the sixth part extends in the first direction, and the first power supply connection part and the second power supply connection part are positioned at opposite sides of the first direction in view of the via.

In one embodiment, the fifth part extends in a second direction different from the first direction, the sixth part extends in the first direction, and the third part and the sixth part are positioned at the same side of the second direction in view of the via.

In one embodiment, the fifth part extends in the first direction and the sixth part extends in a second direction different from the first direction.

The third part may extend in the first direction.

In one embodiment, the first metal pattern and the second metal pattern are formed on a substrate, the first metal pattern is positioned at a first height from a top surface of the substrate, the second metal pattern is positioned at a second height from the top surface of the substrate, and the first height is greater than the second height.

According to still another aspect of the present invention, there is provided e-fuse structure of a semiconductor device, comprising a first metal pattern formed at a first vertical level and including a U-shaped first bent portion and a first auxiliary pattern electrically disconnected from the first bent portion, the first bent portion including a first part and a second part extending in a first direction and positioned to be adjacent to each other with the second part positioned between the first auxiliary pattern and the first part; a first via physically and electrically connected to the first part; and a second metal pattern formed at a second vertical level different from the first vertical level and physically and electrically connected to the first via.

The second metal pattern may include a second bent portion and a power supply connection part connected to the second bent portion, the second bent portion includes a fourth part extending in a second direction different from the first direction, a fifth part having a side surface facing a side surface of the fourth part and being adjacent to the fourth part, and a sixth part connecting one end of the fourth part to one end of the fifth part and extending in the first direction, and the power supply connection part connected to the fourth part.

In one embodiment, the first via is connected to the fifth part.

In one embodiment, the second metal pattern further includes a second auxiliary pattern that is not used as a path of current migration, and the second auxiliary pattern includes a seventh part extending in the first direction and an eighth part extending from one end of the seventh part and extending in the second direction, and one end of the seventh part is connected to one end of the fourth part, and the fifth part is positioned between the seventh part and the sixth part.

In one embodiment, the first metal pattern includes a second auxiliary pattern extending in the first direction with the first part positioned between the second auxiliary pattern and the second part.

The second auxiliary pattern may be connected to the second part and is not used as a path of a program current.

The first auxiliary pattern may extend in the first direction.

The e-fuse structure may further comprise a third metal pattern extending in a second direction different from the first direction and formed at a third vertical level between the first vertical level and the second vertical level; and a second via connecting the third metal pattern to the second metal pattern, and the first via connects the first metal pattern to the third metal pattern.

The third metal pattern may include a connection pattern extending in the first direction and second auxiliary patterns formed at both sides of the connection pattern to be parallel with the connection pattern, and the first via and the second via are connected to the connection pattern.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION OF THE EMBODIMENTS

Figure 1:
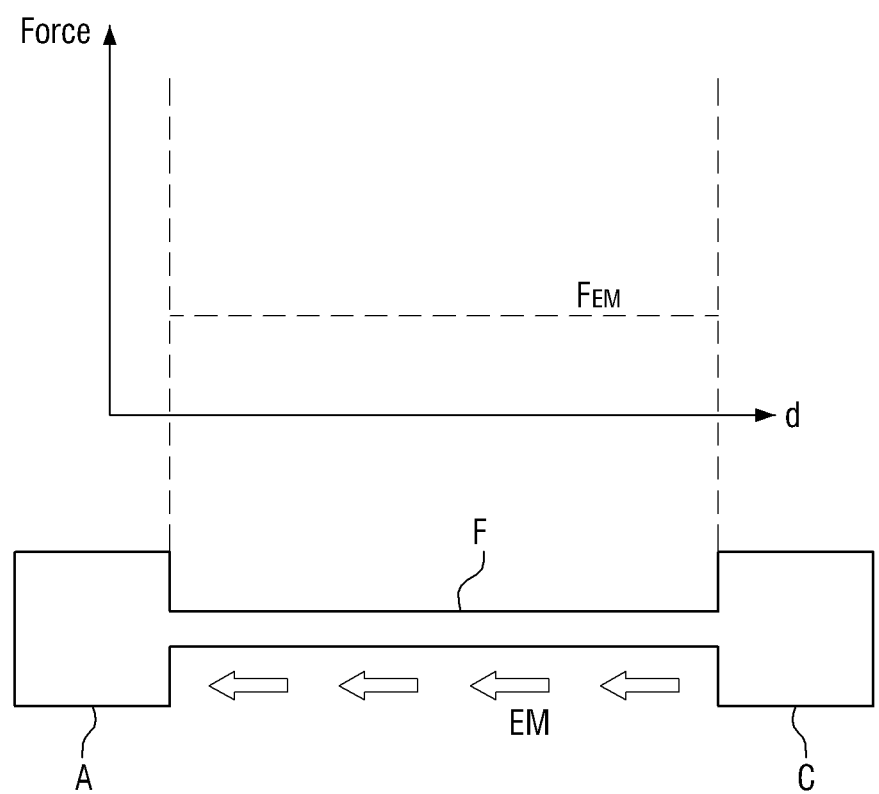
FIG. 1 is a schematic view illustrating an effect of electromigration in a program process of an e-fuse structure according to embodiments of the present invention.

The present disclosure will now be described more fully hereinafter with reference to the accompanying drawings, in which various embodiments of the invention are shown. This invention may, however, be embodied in different forms and should not be construed as limited to the embodiments set forth herein. The same reference numbers indicate the same or similar components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, or "contacting" another element or layer, there are no intervening elements or layers present.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. Unless the context indicates otherwise, these terms are only used to distinguish one element from another element, for example as a naming convention. Thus, for example, a first element, a first component or a first section discussed below could be termed a second element, a second component or a second section without departing from the teachings of the present invention.

As used herein, the term "and/or" includes any and all combinations of one or more of the associated listed items. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," "coplanar," or "parallel" as used herein when referring to orientation, layout, location, shapes, sizes, amounts, or other measures do not necessarily mean an exactly identical, planar, coplanar, or parallel orientation, layout, location, shape, size, amount, or other measure, but are intended to encompass nearly identical, planar, coplanar, or parallel orientation, layout, location, shapes, sizes, amounts, or other measures within acceptable variations that may occur, for example, due to manufacturing processes. The term "substantially" may be used herein to reflect this meaning.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

First, a thermally-assisted electromigration mode used in a program process of e-fuse structures according to embodiments of the present invention will be described with reference to FIGS. 1 to 3.

Figure 2:
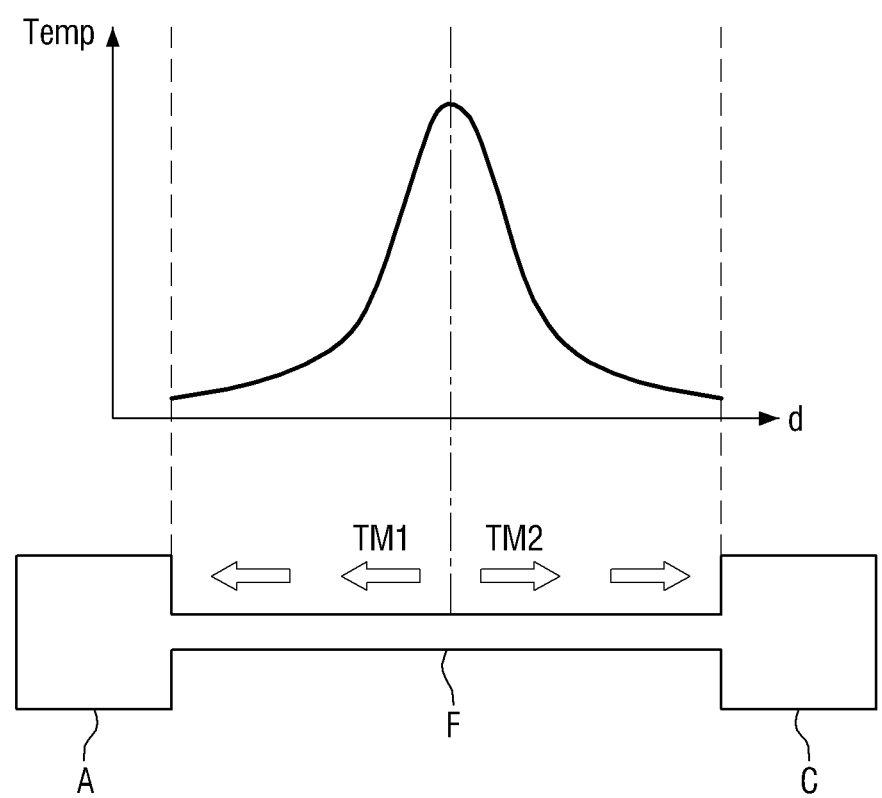
FIG. 2 is a schematic view illustrating an effect of thermomigration in a program process of an e-fuse structure according to embodiments of the present invention.
Figure 3:
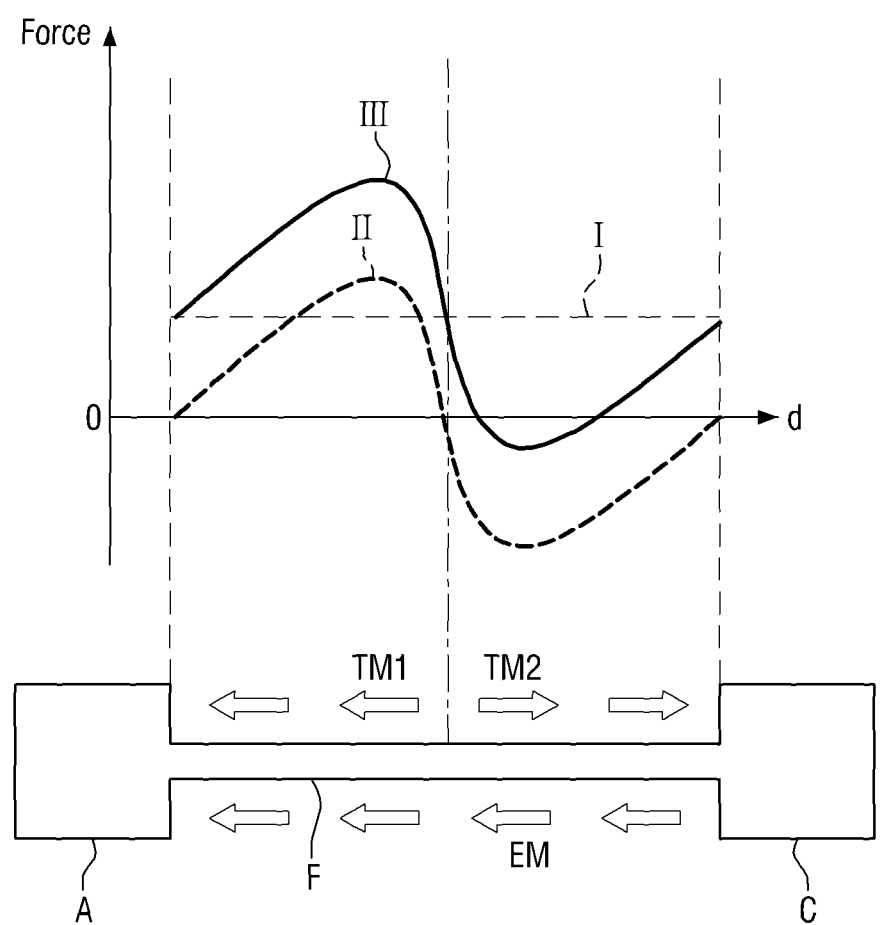
FIG. 3 is a schematic view illustrating effects of electromigration and thermomigration in a program process of an e-fuse structure according to embodiments of the present invention.

FIG. 1 is a schematic view illustrating an effect of electromigration in a program process of e-fuses according to embodiments of the present invention, FIG. 2 is a schematic view illustrating an effect of thermomigration in a program process of e-fuses according to embodiments of the present invention, and FIG. 3 is a schematic view illustrating effects of electromigration and thermomigration in a program process of e-fuses according to embodiments of the present invention. More specifically, in FIG. 3, the curve I represents a driving force derived from electromigration in a fuse link when the e-fuse structure is programmed, the curve II represents a driving force derived from thermomigration, as expressed by a differential of a temperature distribution in a fuse link when the e-fuse structure is programmed, and the curve III represents a total driving force derived from a combination of thermomigration and electromigration.

The e-fuse structure according to certain embodiments of the present invention is a stacked e-fuse structure, and a fuse link F of the e-fuse structure also has a stacked structure. However, for the sake of convenient explanation, linear fuse links as the fuse link F are illustrated in FIGS. 1 to 3.

Programming of the e-fuse structure includes supplying a program current to the fuse link F by applying a predetermined voltage between a cathode C and an anode A. In order to program the e-fuse structure, a negative voltage may be applied to the cathode C and a positive voltage may be applied to the anode A. Accordingly, electrons may flow from the cathode C to the anode A in the fuse link F. When the electrons migrate in the fuse link F, the electrons may collide with atoms constituting the fuse link F, leading to spatial migration of atoms, called an electromigration (EM) phenomenon.

In FIG. 1, the driving force derived from electromigration in the fuse link F (that is, an electronic driving force $F_{EM}$) is uniformly supplied to the entire area of the fuse link F, irrespective of the position of the fuse link F, which is, however, provided only for the sake of convenient explanation. Aspects of the present invention are not limited to this uniform supplying of a driving force. For example, the driving force derived from electromigration in the fuse link F may vary in the fuse link F by being changed into a sectional area of the fuse link F.

In addition, the fuse link F may be made of a metallic material, such as tungsten, aluminum or copper. If a program current is supplied to the fuse link F, Joule's heat may be generated in the fuse link F by the program current. The Joule's heat generated by the program current may form an uneven temperature distribution in the fuse link F, as shown in FIG. 2. The fuse link F showing the uneven temperature distribution may have the maximum temperature at its central part. The uneven temperature distribution may cause thermomigration phenomena TM1 and TM2 of atoms in the fuse link F. The thermomigration phenomena may include first thermomigration TM1 causing atoms to migrate from the center of the fuse link F to the anode A and second thermomigration TM2 causing atoms to migrate from the center of the fuse link F to the cathode C.

Referring to FIG. 3, the driving force derived from electromigration in the fuse link F (that is, the electronic driving force $F_{EM}$) may be supplied to the entire area of the fuse link F, irrespective of the position in the fuse link F. Since the fuse link F has an uneven temperature distribution, the driving force derived from thermomigration (that is, the thermal driving force $F_{TM}$) may be applied to opposite sides of the central part of the fuse link F.

Between the anode A and the central part of the fuse link F, a migration direction of atoms by the electromigration EM and a migration direction of atoms by the first thermomigration TM1 are the same as each other. Therefore, the electronic driving force and the thermal driving force may be combined with each other to increase a total driving force $F_{EM+TM}$ applied to the fuse link F.

Meanwhile, between the cathode C and the central part of the fuse link F, a migration direction of atoms by the electromigration EM and a migration direction of atoms by the first thermomigration TM1 are opposite to each other. Therefore, the electronic driving force and the thermal driving force may be combined with each other to decrease a total driving force $F_{EM+TM}$ applied to the fuse link F.

In certain embodiments, as shown in FIG. 3, the thermal driving force and electronic driving force are combined due to the uneven temperature distribution of the fuse link F, resulting in flux divergence, that is, non-uniform atomic flow rates. Atoms may be depleted or accumulated in regions where the flux divergence occurs. More specifically, in an arbitrary region of the fuse link F, if an out-flowing flux of atoms is greater than an in-flowing flux of atoms, the atoms may be depleted, thereby creating a void. Conversely, in an arbitrary region of the fuse link F, if an in-flowing flux of atoms is greater than an out-flowing flux of atoms, the atoms may be accumulated, thereby generating hill-locks. The creation of the void due to the flux divergence may increase resistance of the fuse link F and the e-fuse structure may be programmed by the increased resistance of the fuse link F.

As described above, when the e-fuse structure is programmed, the larger the flux divergence is supplied to the fuse link F, the faster the void is created due to depletion of atoms.

Accordingly, the e-fuse structure capable of providing a large flux divergence can be provided by adjusting the total driving force applied to the fuse link F. In addition, in designing the e-fuse structure, an area for providing a large flux divergence is produced in the fuse link F, thereby providing the e-fuse structure capable of adjusting void generating locations due to the depletion of atoms.

Next, an e-fuse structure according to a first embodiment of the present invention will be described with reference to FIGS. 4 to 6.

Figure 4:
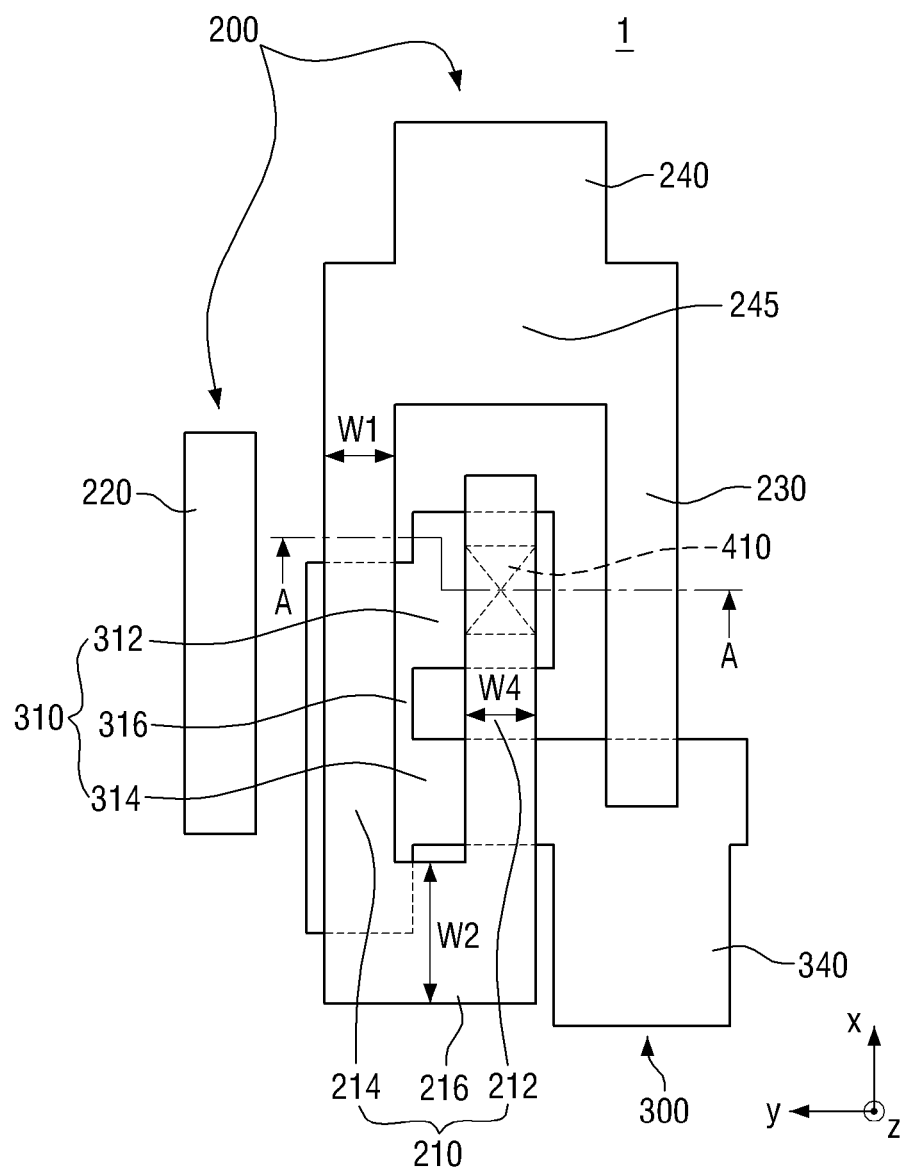
FIGS. 4 to 6 are schematic views illustrating an e-fuse structure according to a first embodiment of the present invention.
Figure 5:
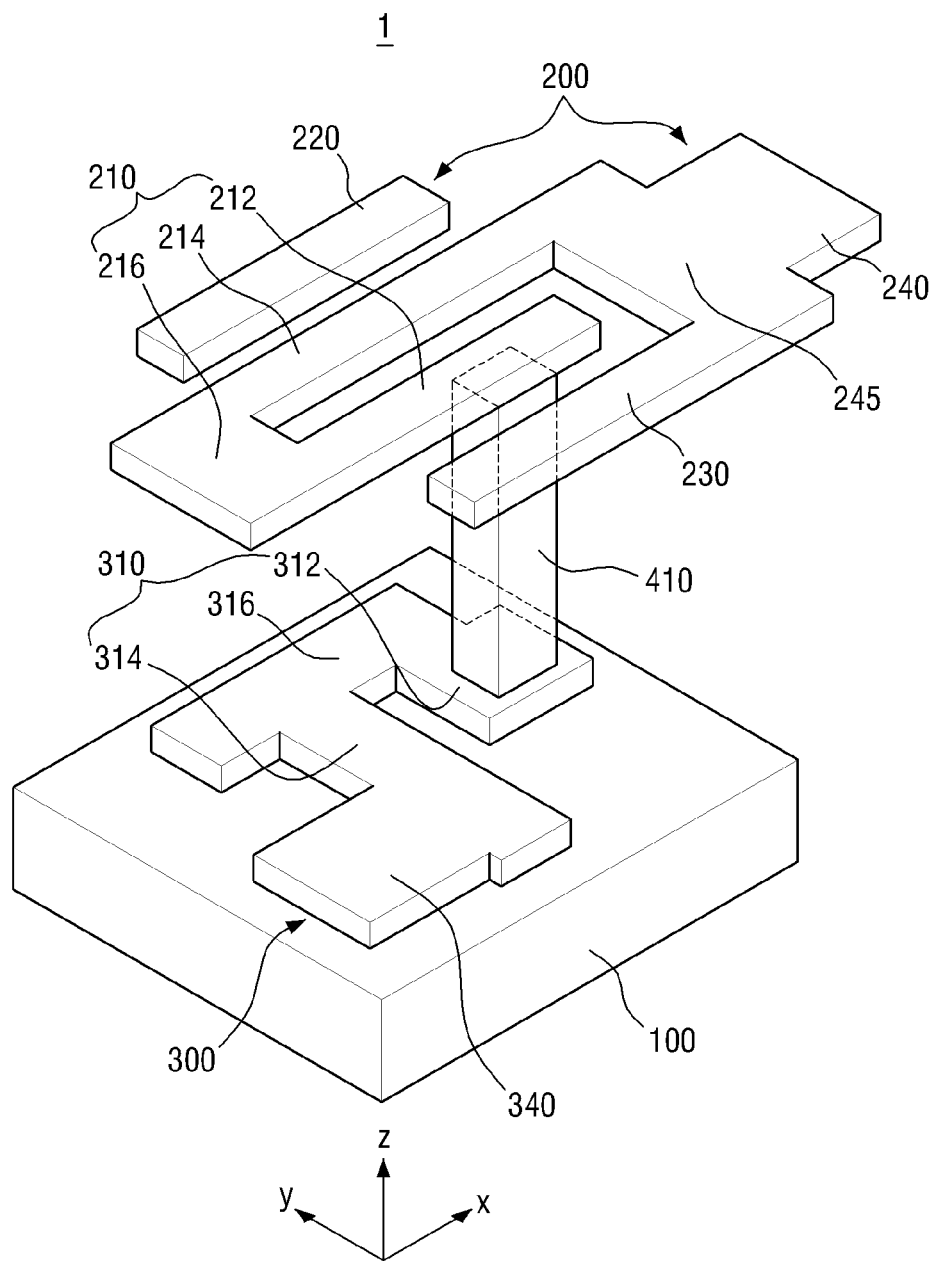
Figure 6:
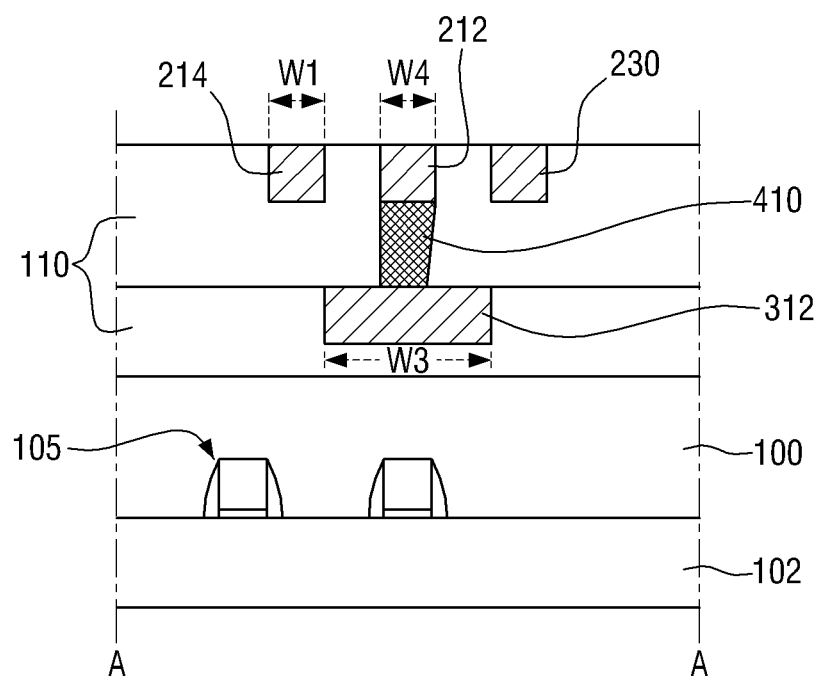

FIGS. 4 to 6 are schematic views illustrating an e-fuse structure according to a first embodiment of the present invention. Specifically, FIG. 4 is a plan view of an e-fuse structure according to a first embodiment of the present invention, FIG. 5 is a perspective view of the e-fuse structure shown in FIG. 4, and FIG. 6 is a cross-sectional view taken along the line A-A of FIG. 4. For brevity, an interlayer insulation layer 110 is not illustrated in FIGS. 4 and 5.

Referring to FIGS. 4 to 6, the e-fuse structure 1 according to the first embodiment of the present invention may include a first metal pattern 200, a first via 410 and a second metal pattern 300.

The first metal pattern 200 is formed at a first metal level and the second metal pattern 300 is formed at a second metal level different from the first metal level. Therefore, the e-fuse structure 1 according to one embodiment of the present invention has a stacked metal structure.

In the e-fuse structure according to certain embodiments of the present invention, the first metal level may be higher than the second metal level. The first metal pattern 200 and the second metal pattern 300 are formed on a substrate 102. For example, the first metal pattern 200 and the second metal pattern 300 are formed on the substrate 102 having circuit patterns 105.

In more detail, the first metal pattern 200 and the second metal pattern 300 may be formed on a pre metal dielectric (PMD) 100 covering the substrate 102 having the circuit patterns 105. The first metal pattern 200 and the second metal pattern 300 may be formed in an interlayer insulation layer 110 formed on the PMD 100. Thus, the e-fuse structure according to one embodiment of the present invention may be formed through a back end of line (BEOL) process.

When the first metal pattern 200 is positioned at the first height from the top surface of the substrate 102 and the second metal pattern 300 is positioned at the second height from the top surface of the substrate 102, the first height is greater than the second height. In other words, a height ranging from the top surface of the substrate 102 to the first metal level at which the first metal pattern 200 is formed is greater than a height ranging from the top surface of the substrate 102 to the second metal level at which the second metal pattern 300 is formed.

The substrate 102 may be, for example, a bulk silicon wafer or a silicon-on-insulator (SOI). Alternatively, the substrate 102 may be a silicon substrate or may include a material other than silicon. For example, the substrate 102 may include at least one of germanium, silicon germanium, indium antimonide, a lead telluride compound, indium arsenic, indium phosphide, gallium arsenic, gallium antimonide, or other suitable substrate materials, but is not limited thereto.

The circuit patterns 105 may constitute circuit devices. The circuit devices may include a plurality of memory devices. The memory devices may include, for example, volatile semiconductor memory devices and non-volatile semiconductor memory devices. Examples of the volatile semiconductor memory devices may include DRAM, SRAM, and so on. Examples of the non-volatile semiconductor memory devices may include EPROM, EEPROM, Flash EEPROM, and so on.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

The PMD 100 may include, for example, at least one of a low-k material, an oxide layer, a nitride layer and an oxynitride layer. Examples of the low-k material may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD), or combinations thereof, but are not limited thereto.

The interlayer insulation layer 110 may include, for example, at least one of a low-k material, an oxide layer, a nitride layer and an oxynitride layer.

In the e-fuse structure according to certain embodiments of the present invention, a positive voltage is applied to the first metal pattern 200 and a negative voltage is applied to the second metal pattern 300. When a program current is supplied to the e-fuse structure, the current flows from the first metal pattern 200 to the second metal pattern 300. Thus, electrons migrate from the second metal pattern 300 to the first metal pattern 200.

Referring to FIGS. 1 to 3, the first metal pattern 200 is connected to the anode A and the second metal pattern 300 is connected to the cathode C.

Referring to FIGS. 4 to 6, the first metal pattern 200 may include a first bent portion 210 and a first auxiliary pattern 220.

The first bent portion 210 may extend in a first direction X and may include a first part 212 and a second part 214 nearest to each other. The first part 212 of the first bent portion and the second part 214 of the first bent portion may be formed to be parallel to each other in the first direction X. The term "nearest" used herein may mean that there is no intervening metal pattern between one surface of the first part 212 of the first bent portion and one surface of the second part 214 of the first bent portion, which face each other. Thus, in one embodiment, only the interlayer insulation layer 110 exists between the one surface (e.g., side surface) of the first part 212 of the first bent portion and the one surface (e.g., side surface) of the second part 214 of the first bent portion, facing each other.

The first part 212 of the first bent portion and the second part 214 of the first bent portion are electrically connected to each other.

The first bent portion 210 includes a third part 216 connecting the first part 212 of the first bent portion to the second part 214 of the first bent portion. The third part 216 of the first bent portion may extend in a second direction Y.

The third part 216 of the first bent portion connecting one end of the first part 212 of the first bent portion to one end of the second part 214 of the first bent portion is illustrated in FIGS. 4 and 5, but aspects of the present invention are not limited thereto. For example, though FIGS. 4 and 5 depict the parts of the first bent portion 210 having straight edges and right angles with respect to each other, the parts may be combined in a more continuous curve structure, for example to have a bent "U" shape rather than the depicted angled "Π" shape.

In the following description of the e-fuse structure according to the embodiments of the present invention, it is assumed that the first part 212 of the first bent portion, the third part 216 of the first bent portion, and the second part 214 of the first bent portion, sequentially connected to one another, may form a "U"-shaped configuration. Thus, the following description will be made with regard to a case where the first bent portion 210 is "U"-shaped (whether curved or angled).

A width of the first part 212 of the first bent portion may be a first width W4, a width of the second part 214 of the first bent portion may be a second width W1, and a width of the third part 216 of the first bent portion may be a third width W2. The width W4 of the first part 212 of the first bent portion and the width W1 of the second part 214 of the first bent portion may mean widths in the second direction Y along the respective first and second parts 212 and 214, and the width W2 of the third part 216 of the first bent portion may mean a width in the first direction X along the third part 216. Each width described above may be a width of the associated part of the bent portion between an outer side surface (e.g. outside of the U-shape) and an inner side surface (e.g., inside of the U-shape).

In the e-fuse structures according to certain embodiments of the present invention, the width W4 of the first part 212 of the first bent portion is greater than the width W1 of the second part 214 of the first bent portion. In addition, in the e-fuse structure according to certain embodiments of the present invention, the width W2 of the third part 216 of the first bent portion is greater than the width W1 of the second part 214 of the first bent portion. Thus, in the first bent portion 210, the width W1 of the second part 214 of the first bent portion may have the smallest value.

Let the width W1 of the second part 214 of the first bent portion be L. In one embodiment, the width W2 of the third part 216 of the first bent portion may be greater than L and smaller than or equal to 2L. In certain embodiments, the width W4 of the first part 212 of the first bent portion may be greater than L and smaller than 1.5L. Furthermore, the space between the first part 212 of the first bent portion and the second part 214 of the first bent portion may be smaller than L. Also, the width of the auxiliary pattern 220 may be greater than or equal to L and smaller than 1.5L, and the space between the second part 214 of the first bent portion and the auxiliary pattern 220 may be smaller than L.

In order to program the e-fuse structure according to certain embodiments of the present invention at a relatively low voltage, a current density may be increased by reducing a sectional area of the second part 214 of the first bent portion. One way to accomplish this is by reducing the width W1 of the second part 214 of the first bent portion. The width W1 of the second part 214 of the first bent portion may have a critical dimension. For example, the second part 214 of the first bent portion may have a minimum line width that can be formed using photolithography.

In the e-fuse structure according to certain embodiments of the present invention, the second part 214 of the first bent portion may be a portion where a void is created when a program current is supplied, which will later be described with reference to FIG. 32.

In addition, since the first metal pattern 200 includes the first bent portion 210, a relatively large amount of Joule's heat may be generated in the first bent portion 210. Further, since the first metal pattern 200 includes the first bent portion 210, heat integration in the e-fuse structure can be enhanced.

The first auxiliary pattern 220 may extend in the first direction X. The first auxiliary pattern 220 may be formed to be near to the first bent portion 210, for example, near the second part 214 of the first bent portion. In one embodiment, the first auxiliary pattern 220 faces the first part 212 of the first bent portion 210 with the second part 214 of the first bent portion positioned between the first auxiliary pattern 220 and the first part 212 of the first bent portion (e.g., a side surface of the first auxiliary pattern 220 may face an opposite side surface of the first part 212 of the first bent portion 210). As a result, the second part 214 of the first bent portion is positioned between the first auxiliary pattern 220 and the first part 212 of the first bent portion.

The first auxiliary pattern 220 is shown as extending in the first direction X and formed to be parallel with the second part 214 of the first bent portion in FIGS. 4 and 5, but aspects of the present invention are not limited thereto.

Nonetheless, in the e-fuse structure according to certain embodiments of the present invention, the first auxiliary pattern 220, the second part 214 of the first bent portion and the first part 212 of the first bent portion extend in the first direction X and may be sequentially formed with respect to one another to be adjacent to each other. For example, with regard to metal patterns, the first auxiliary pattern 220 may be immediately adjacent to the second part 214 of the first bent portion, and the second part 214 of the first bent portion may be immediately adjacent to the first part 212 of the first bent portion.

The first auxiliary pattern 220 is separated from the first bent portion 210 to be electrically disconnected from the first bent portion 210. Therefore, when a program current is supplied to the e-fuse structure, the first auxiliary pattern 220 is not used as a path for the flow of current.

In the e-fuse structure according to certain embodiments of the present invention, the first auxiliary pattern 220 performs the following functions.

First, the first auxiliary pattern 220 and the first part 212 of the first bent portion may reduce the width W1 of the second part 214 of the first bent portion. For example, because the first auxiliary pattern 220 and the first part 212 of the first bent portion are formed at opposite sides of the second part 214 of the first bent portion, the width W1 of the second part 214 of the first bent portion is reduced. More specifically, the first auxiliary pattern 220 is formed to be parallel with the second part 214 of the first bent portion in a photolithography process, thereby preventing the width W1 of the second part 214 of the first bent portion from being increased.

Next, the first auxiliary pattern 220 serves to prevent propagation of cracks. In detail, if a program current is supplied to the e-fuse structure, a void may be created in the second part 214 of the first bent portion. Since the void is created in the second part 214 of the first bent portion, a crack may also be generated in the interlayer insulation layer 110 existing in vicinity of the second part 214 of the first bent portion. The first auxiliary pattern 220 prevents the cracks generated when the void is created in the second part 214 of the first bent portion from being further propagated.

In addition, the first auxiliary pattern 220 promotes integration of the heat generated in the e-fuse structure. For example, the first auxiliary pattern 220 may enhance heat integration in the e-fuse structure by preventing the Joule's heat generated from the first bent portion 210 from being rapidly propagated to the vicinity of the e-fuse structure.

The first metal pattern 200 may further include a second auxiliary pattern 230. The second auxiliary pattern 230 may extend in the first direction X. The second auxiliary pattern 230 may be formed to be adjacent to the first bent portion 210, more specifically, the first part 212 of the first bent portion. The second auxiliary pattern 230 faces the second part 214 of the first bent portion (e.g. side surfaces thereof face each other) with the first part 212 of the first bent portion positioned between the second auxiliary pattern 230 and the second part 214 of the first bent portion. Thus, the first part 212 of the first bent portion is positioned between the second auxiliary pattern 230 and the second part 214 of the first bent portion. For example, with regard to metal patterns, the second part 214 of the first bent portion may be immediately adjacent to the first part 212 of the first bent portion, and the first part 212 of the first bent portion may be immediately adjacent to the second auxiliary pattern 230.

The second auxiliary pattern 230 electrically connected to the first bent portion 210 is illustrated in FIGS. 4 and 5, but aspects of the present invention are not limited thereto. For example, these components may have certain curved features rather than linear and angled features. While the first bent portion 210 and the second auxiliary pattern 230 are connected to each other in the illustrated embodiment, the second auxiliary pattern 230 is not used as a path for the flow of current when a program current is supplied to the e-fuse structure.

In the e-fuse structure according to certain embodiments of the present invention, the second auxiliary pattern 230 performs the following functions.

First, the second auxiliary pattern 230 may reduce the width W4 of the first part 212 of the first bent portion. For example, because the second auxiliary pattern 230 is formed at one side of the first part 212 of the first bent portion, the width W4 of the first part 212 of the first bent portion may be prevented from being increased.

Next, the second auxiliary pattern 230 prevents a temperature of the first bent portion 210 from being lowered due to rapid propagation of the Joule's heat generated in the first bent portion 210 to the vicinity of the e-fuse structure, thereby enhancing the heat integration in the e-fuse structure.

The first metal pattern 200 may further include an extension pattern 245. The extension pattern 245 may connect the first bent portion 210 to the second auxiliary pattern 230. The extension pattern 245 may extend, for example, in the second direction Y.

The extension pattern 245 connecting the other end of the second part 214 of the first bent portion and one end of the second auxiliary pattern 230 is illustrated in FIGS. 4 and 5, but aspects of the present invention are not limited thereto. For example, these components may have certain curved features rather than linear and angled features. A first end of the second part 214 of the first bent portion may be connected (e.g., directly connected) to the third part 216 of the first bent portion (e.g., by being integrally formed together) and a second, opposite end of the second part 214 of the first bent portion may be connected (e.g., directly connected) to the extension pattern 245 (e.g., by being integrally formed together).

In the following description of the e-fuse structure according to various embodiments of the present invention, it is assumed that the second part 214 of the first bent portion, the extension pattern 245 and the second auxiliary pattern 230, sequentially connected to one another, may form a "U"-shaped configuration.

In FIGS. 4 and 5, the first bent portion 210, and the extension pattern 245 and the second auxiliary pattern 230 sequentially connected to the first bent portion 210, may form a spiral configuration, for example. In addition, the second part 214 of the first bent portion, the first part 212 of the first bent portion and the second auxiliary pattern 230 may extend in the first direction X to be parallel with each other. In one embodiment, the first part 212 of the first bent portion and the second part 214 of the first bent portion are formed to be nearest to each other among these three parallel components, and a distance between the first part 212 of the first bent portion and the second part 214 of the first bent portion is smaller than a distance between the second part 214 of the first bent portion and the second auxiliary pattern 230.

The first metal pattern 200 may further include a first power supply connection part 240. The first power supply connection part 240 is connected to the anode A shown in FIGS. 1 to 3. In FIGS. 4 and 5, the first power supply connection part 240 is connected to the extension pattern 245 and is connected to the second part 214 of the first bent portion through the extension pattern 245. The first power supply connection part 240 may extend from the extension pattern 245 in the first direction X (and may be integrally formed therewith), but aspects of the present invention are not limited thereto.

The first power supply connection part 240 may be positioned opposite the first bent portion 210 with the extension pattern 245 positioned between the first power supply connection part 240 and the first bent portion 210. As such, in certain embodiments, a first end of the first part 212 of the first bent portion that is not connected to the third part 216 of the first bent portion faces the first power supply connection part 240 with the extension pattern 245 positioned between the first end of the first part 212 of the first bent portion and the first power supply connection part 240.

In the illustrated embodiment of FIGS. 4 and 5, the e-fuse structure further includes the first power supply connection part 240, but aspects of the present invention are not limited thereto. For example, in a case where the extension pattern 245 extends in the second direction Y longer than in FIGS. 4 and 5, the extension pattern 245 may be connected to the anode A shown in FIGS. 1 to 3 without the first power supply connection part 240.

In FIGS. 4 and 5, one end of the second auxiliary pattern 230 is connected to the first power supply connection part 240 while the other end of the second auxiliary pattern 230 is opened (e.g., floating). For example, the second auxiliary pattern 230 is branched off from the extension pattern 245, while the end of the second auxiliary pattern 230 is opened. Therefore, even if a positive voltage is applied to the first power supply connection part 240 to supply a program current to the e-fuse structure 1, the current does not flow in the second auxiliary pattern 230. Thus, the second auxiliary pattern 230 is not used as a path of current migration.

The first metal pattern 200 may be made, for example, of one selected from tungsten (W), aluminum (Al), copper (Cu) and a copper (Cu) alloy. Here, the copper (Cu) alloy may include C, Ag, Co, Ta, In, Sn, Zn, Mn, Ti, Mg, Cr, Ge, Sr, Pt, Mg, Al or Zr alloyed in Cu.

A barrier layer may further be formed between the first metal pattern 200 and the interlayer insulation layer 110 to prevent a metallic material constituting the first metal pattern 200 from being diffused into the interlayer insulation layer 110 around the first metal pattern 200. For example, the barrier layer may include one of Ta, TaN, TaSiN, Ti, TiN, TiSiN, W, WN and combinations thereof.

Referring to FIGS. 4 and 5, the second metal pattern 300 may include a second bent portion 310 and a second power supply connection part 340.

The second bent portion 310 includes a first part 312 and a second part 314 facing each other and positioned to be near to each other. The second part 314 of the second bent portion may extend in the second direction Y.

In addition, the second bent portion 310 may include a third part 316 connecting the first part 312 of the second bent portion to the second part 314 of the second bent portion. The third part 316 of the second bent portion may extend in the first direction X.

The third part 316 of the second bent portion connecting one end of the first part 312 of the second bent portion and one end of the second part 314 of the second bent portion, which face each other, is illustrated in FIGS. 4 and 5, but aspects of the present invention are not limited thereto. Similar to the description above, though certain angles and straight line patterns are shown in FIGS. 4 and 5, the second bent portion 310 may include curved features and/or angled features.

The second metal pattern 300 is electrically connected to the first metal pattern 200. In one embodiment, the second bent portion 310 of the second metal pattern 300 is electrically connected to the first part 212 of the first bent portion 210 of the first metal pattern 200. More specifically, the first part 312 of the second bent portion and the first part 212 of the first bent portion may be electrically connected to each other, through the use of the first via 410, which is generally referred to herein as a via structure, or conductive via structure. This may be described as a direct electrical connection through the first via 410, or a first via structure (e.g., only a via structure is electrically connected between the first part 312 of the second bent portion and the first part 212 of the first bent portion).

A width of the first part 312 of the second bent portion may be a fourth width W3. For example, the width W3 of the first part 312 of the second bent portion may mean a width of the second direction Y, and may refer to a width between a first side of the first part 312 and an opposite side of the first part 312 where the first part 312 meets the third part 316.

In the e-fuse structure according to certain embodiments of the present invention, the width W3 of the first part 312 of the second bent portion is greater than a width W4 of the first part 212 of the first bent portion electrically connected to the second metal pattern 300.

When a program current is supplied to the e-fuse structure according to one embodiment of the present invention, the first part 312 of the second bent portion, the first part 212 of the first bent portion and the second part 214 of the first bent portion are used as paths for the flow of current.

Here, the width W3 of the first part 312 of the second bent portion is greater than the width W4 of the first part 212 of the first bent portion, and the width W4 of the first part 212 of the first bent portion is greater than the width W1 of the second part 214 of the first bent portion. It is assumed that the first metal pattern 200 and the second metal pattern 300 have the same thickness in a third direction Z. When the program current is supplied to the e-fuse structure, a current density of the second part 214 of the first bent portion is greater than a current density of the first part 212 of the first bent portion, and the current density of the first part 212 of the first bent portion is greater than a current density of the first part 312 of the second bent portion. Therefore, among the second part 214 of the first bent portion, the first part 212 of the first bent portion and the first part 312 of the second bent portion, the second part 214 of the first bent portion may have the greatest current density.

Since the second metal pattern 300 includes the second bent portion 310, a relatively large amount of Joule's heat may be generated in the first bent portion 210. Further, since the first metal pattern 200 includes the first bent portion 210, heat integration in the e-fuse structure can be enhanced.

The second power supply connection part 340 of the second metal pattern 300 is connected to the cathode C shown in FIGS. 1 to 3. The second power supply connection part 340 is connected to the second part 314 of the second bent portion. The second power supply connection part 340 may extend from the second part 314 of the second bent portion in the first direction X, but aspects of the present invention are not limited thereto.

The second metal pattern 300 may be made, for example, of one selected from tungsten (W), aluminum (Al), copper (Cu) and a copper (Cu) alloy. Here, the copper (Cu) alloy may include C, Ag, Co, Ta, In, Sn, Zn, Mn, Ti, Mg, Cr, Ge, Sr, Pt, Mg, Al or Zr alloyed in Cu.

A barrier layer may further be formed between the second metal pattern 300 and the interlayer insulation layer 110 to prevent a metallic material constituting the second metal pattern 300 from being diffused into the interlayer insulation layer 110 around the second metal pattern 300. For example, the barrier layer may include one of Ta, TaN, TaSiN, Ti, TiN, TiSiN, W, WN and combinations thereof.

The first via 410, also referred to as a conductive via, is formed between the first metal pattern 200 and the second metal pattern 300. The first via 410 connects the first metal pattern 200 to the second metal pattern 300.

The first via 410 connects the first bent portion 210 to the second bent portion 310. Specifically, the first via 410 connects the first part 212 of the first bent portion to the first part 312 of the second bent portion.

The first via 410 may be made, for example, of one selected from tungsten (W), aluminum (Al), copper (Cu) and a copper (Cu) alloy. Here, the copper (Cu) alloy may include C, Ag, Co, Ta, In, Sn, Zn, Mn, Ti, Mg, Cr, Ge, Sr, Pt, Mg, Al or Zr alloyed in Cu.

A barrier layer may further be formed between the first via 410 and the interlayer insulation layer 110 to prevent a metallic material constituting the first via 410 from being diffused into the interlayer insulation layer 110 around the first via 410. For example, the barrier layer may include one of Ta, TaN, TaSiN, Ti, TiN, TiSiN, W, WN and combinations thereof.

In a case where a positive voltage is applied to the first power supply connection part 240 of the first metal pattern 200 and a negative positive voltage is applied to the second power supply connection part 340 of the second metal pattern 300, electrons pass to the first via 410 through the second bent portion 310 and migrate to the first bent portion 210. Here, the first auxiliary pattern 220 and the second auxiliary pattern 230 are not used as conductive wires for the flow of electrons.

In the e-fuse structure 1 according to the first embodiment of the present invention, the first power supply connection part 240 and the second power supply connection part 340 are positioned at opposite sides of the first via 410 in the first direction X.

In addition, in the e-fuse structure 1 according to the first embodiment of the present invention, the third part 316 of the second bent portion, the second part 214 of the first bent portion and the first auxiliary pattern 220 are positioned at the same side of the first via 410 in the second direction Y.

In order to enhance heat generation in the e-fuse structure, the first metal pattern 200 and the second metal pattern 300 respectively including the first bent portion 210 and the second bent portion 310 are formed. If lengths of the first bent portion 210 and the second bent portion 310 are increased, the heat generation in the e-fuse structure can be further enhanced. In this case, however, a current density may be reduced due to increased resistance. If the current density of a region where creation of void is intended is reduced, the voltage applied to the e-fuse structure should be increased to compensate for the reduction in the current density. Thus, in a case where the voltage applied to the e-fuse structure is increased, the e-fuse structure may not be able to be programmed, the reliability of a semiconductor device including the e-fuse structure may be impaired.

However, in the e-fuse structure according to certain embodiments of the present invention, a metal pattern is not formed in a space between the first part 212 of the first bent portion connected to the first via 410 and the extension pattern 245 connected to the first bent portion 210, and the extension pattern 245 and the first part 212 of the first bent portion may directly face each other. In addition, since a metal pattern is not formed in a space between the first part 312 of the second bent portion connected to the first via 410 and the second part 314 of the second bent portion connected to the second power supply connection part 340, the first part 312 of the second bent portion and the second part 314 of the second bent portion may directly face each other.

Therefore, the e-fuse structures according to the embodiments described herein can perform programming while enhancing heat integration.

Next, e-fuse structures according to second and third embodiments of the present invention will be described with reference to FIGS. 7 to 10.

Figure 7:
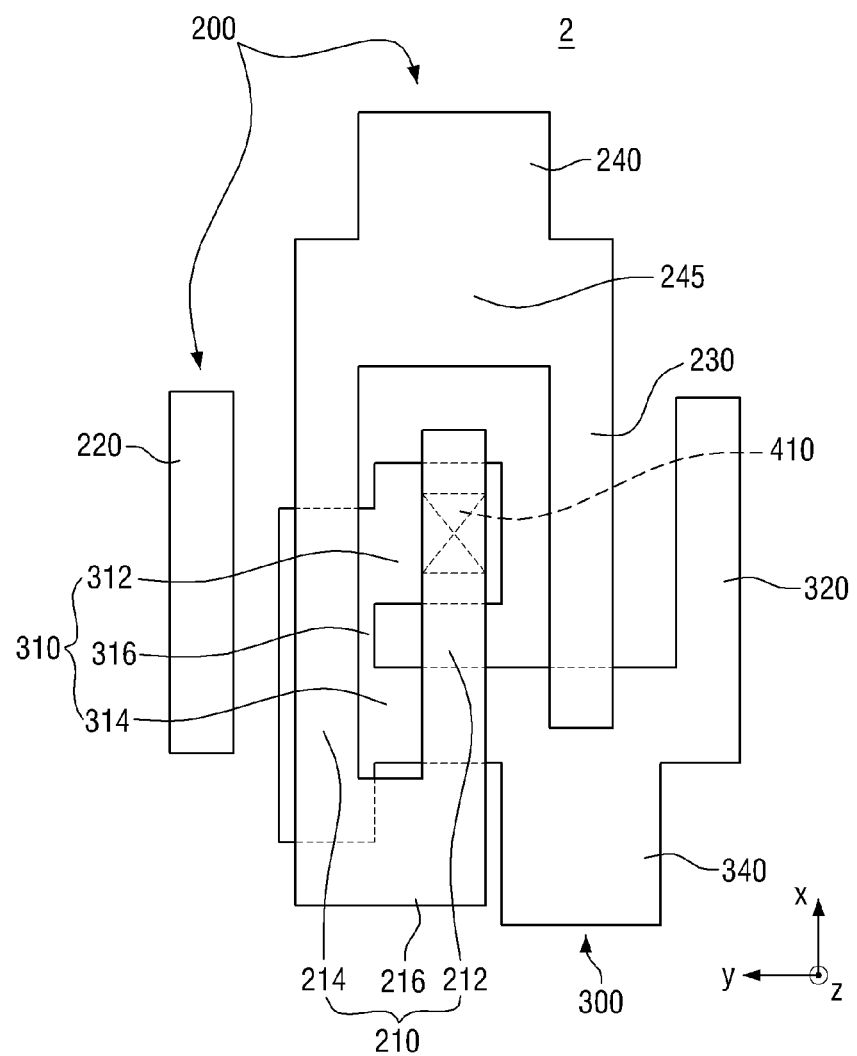
FIGS. 7 and 8 are schematic views illustrating an e-fuse structure according to a second embodiment of the present invention.
Figure 8:
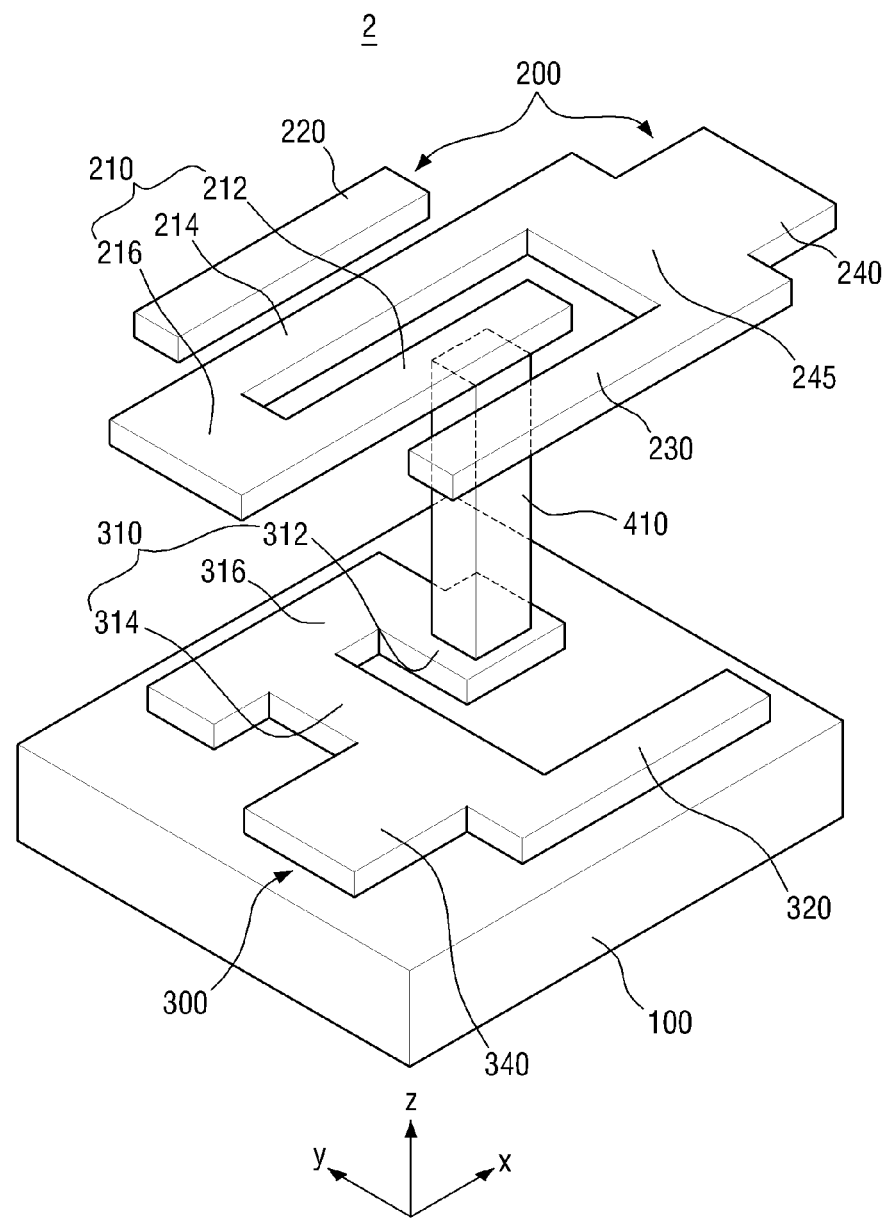
Figure 9:
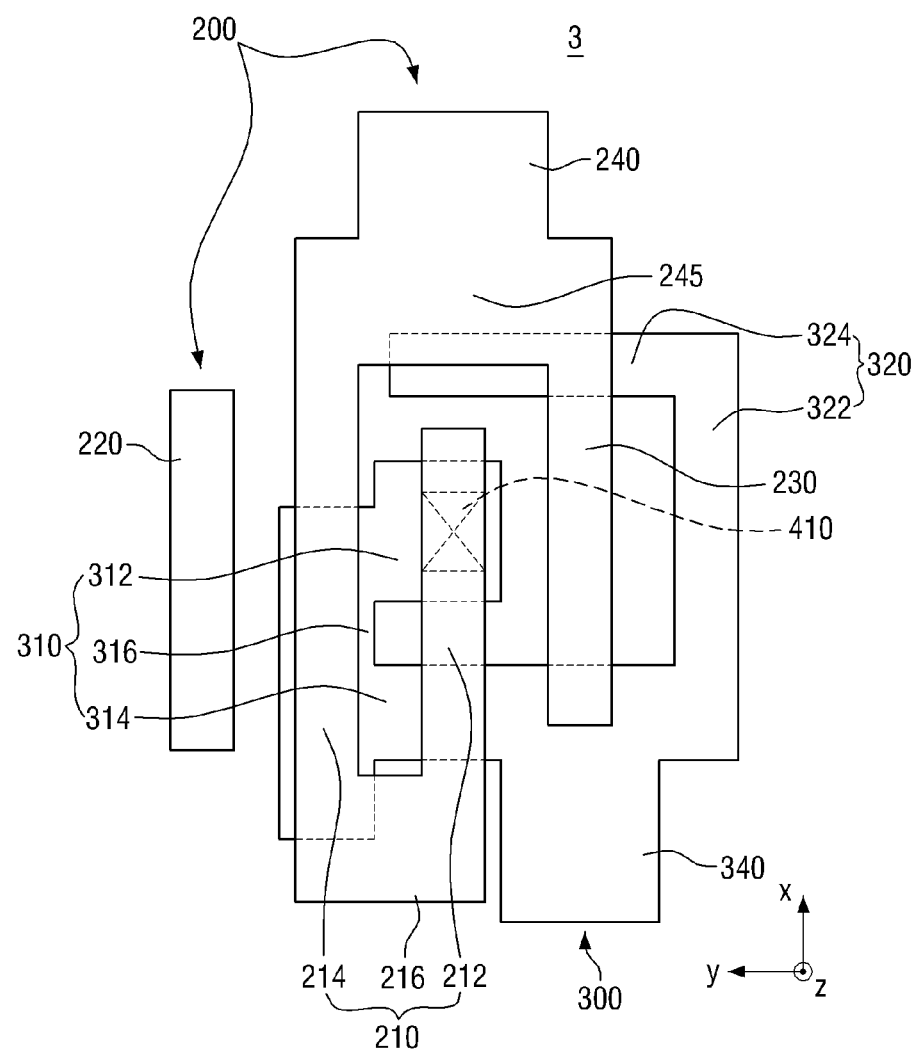
FIGS. 9 and 10 are schematic views illustrating an e-fuse structure according to a third embodiment of the present invention.
Figure 10:
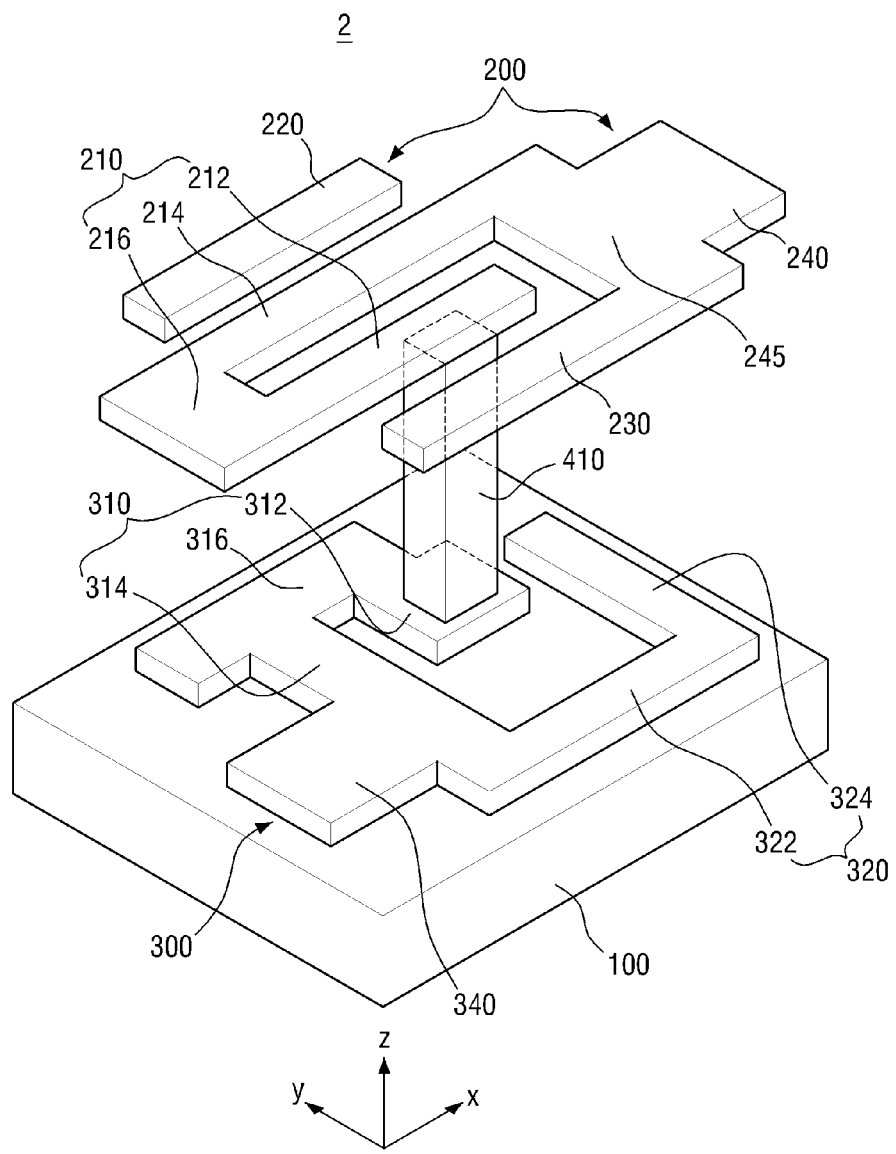

FIGS. 7 and 8 are schematic views illustrating an e-fuse structure according to a second embodiment of the present invention and FIGS. 9 and 10 are schematic views illustrating an e-fuse structure according to a third embodiment of the present invention.

Specifically, FIGS. 7 and 9 are plan views of e-fuse structures according to second and third embodiments of the present invention and FIGS. 8 and 9 are perspective views of the e-fuse structures according to the second and third embodiments of the present invention. For the sake of convenient explanation, the following description will focus on differences between the e-fuse structures shown in FIGS. 4 to 6 and the e-fuse structures shown in FIGS. 7 to 10.

Referring to FIGS. 7 and 8, in the e-fuse structure 2 according to the second embodiment of the present invention, a second metal pattern 300 further includes a third auxiliary pattern 320.

The third auxiliary pattern 320 extends in the first direction X. A side surface of the third auxiliary pattern 320 faces a side surface of the third part 316 of a second bent portion with a first part 312 of the second bent portion and a second part 314 of the second bent portion positioned between the third auxiliary pattern 320 and the third part 316 of the second bent portion.

One end of the second part 314 of the second bent portion may be connected to the third part 316 of the second bent portion and the other end of the second part 314 of the second bent portion may be connected to the third auxiliary pattern 320.

In the illustrated embodiment, the second bent portion 310 and the third auxiliary pattern 320 are connected to each other. However, when a program current is supplied to the e-fuse structure, the third auxiliary pattern 320 is not used as a path for the flow of current.

The third auxiliary pattern 320 connected to the second bent portion 310 is illustrated in FIGS. 7 and 8, but aspects of the present invention are not limited thereto. For example, the third auxiliary pattern 320 and the second part 314 of the second bent portion may be spaced apart from each other to then be electrically disconnected.

The third auxiliary pattern 320 prevents Joule's heat generated from the second bent portion 310 from emanating to the vicinity of the e-fuse, thereby enhancing heat integration in the e-fuse structure.

Referring to FIGS. 9 and 10, in the e-fuse structure 3 according to the third embodiment of the present invention, a second metal pattern 300 further includes a third auxiliary pattern 320 including a first part 322 and a second part 324.

The first part 322 of the third auxiliary pattern 320 extends in the first direction X. The second part 324 of the third auxiliary pattern 320 extends in the second direction Y.

A side surface of the first part 322 of the third auxiliary pattern 320 faces a side surface of the third part 316 of a second bent portion with the first part 312 of the second bent portion and the second part 314 of the second bent portion positioned between the first part 322 of the third auxiliary pattern 320 and the third part 316 of the second bent portion. The second part 324 of the third auxiliary pattern 320 is formed to be parallel with the second part 314 of the second bent portion with the first part 312 of the second bent portion positioned between the second part 324 of the third auxiliary pattern 320 and the second part 314 of the second bent portion.

The first part 322 of the third auxiliary pattern 320 may be connected to the second bent portion 310, specifically to the second part 314 of the second bent portion and the second part 324 of the third auxiliary pattern 320. The first part 322 of the third auxiliary pattern 320 and the third auxiliary pattern 320 connected to the second part 324 of the third auxiliary pattern 320 may form an "L" configuration, but aspects of the present invention are not limited thereto.

While the third auxiliary pattern 320 is connected to the second power supply connection part 340, one end of the second part 324 of the third auxiliary pattern 320 is opened (e.g., floating), so that the third auxiliary pattern 320 is not used as a path for the flow of current when a program current is supplied to the e-fuse structure.

The third auxiliary pattern 320 connected to the second bent portion 310 is illustrated in FIGS. 9 and 10, but aspects of the present invention are not limited thereto. For example, in one embodiment, the third auxiliary pattern 320 and the second part 314 of the second bent portion may be spaced apart from each other to then be electrically disconnected.

In addition, the first part 322 of the third auxiliary pattern 320 and the second part 324 of the third auxiliary pattern 320 are connected to each other in the illustrated embodiment, but aspects of the present invention are not limited thereto.

Hereinafter, e-fuse structures according to fourth to sixth embodiments of the present invention will be described with reference to FIGS. 11 to 13.

Figure 11:
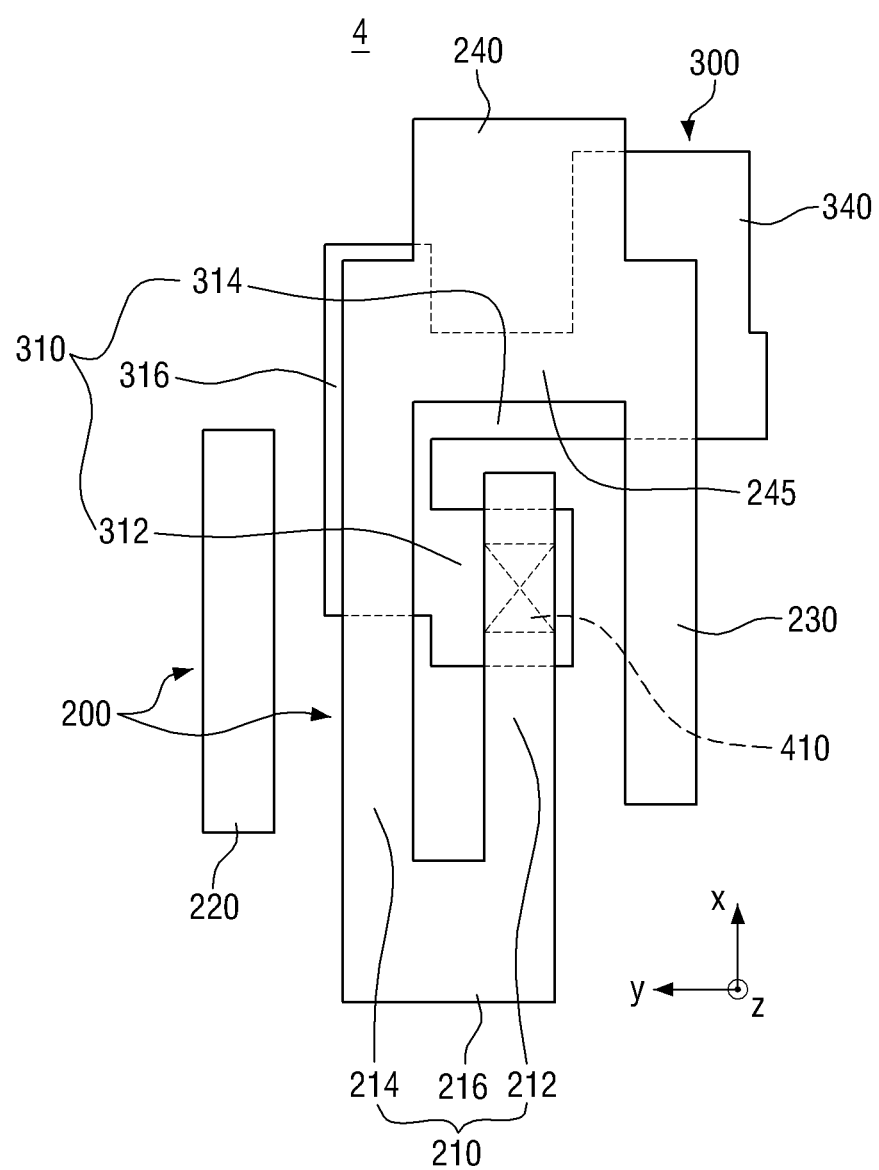
FIG. 11 is a schematic view illustrating an e-fuse structure according to a fourth embodiment of the present invention.
Figure 12:
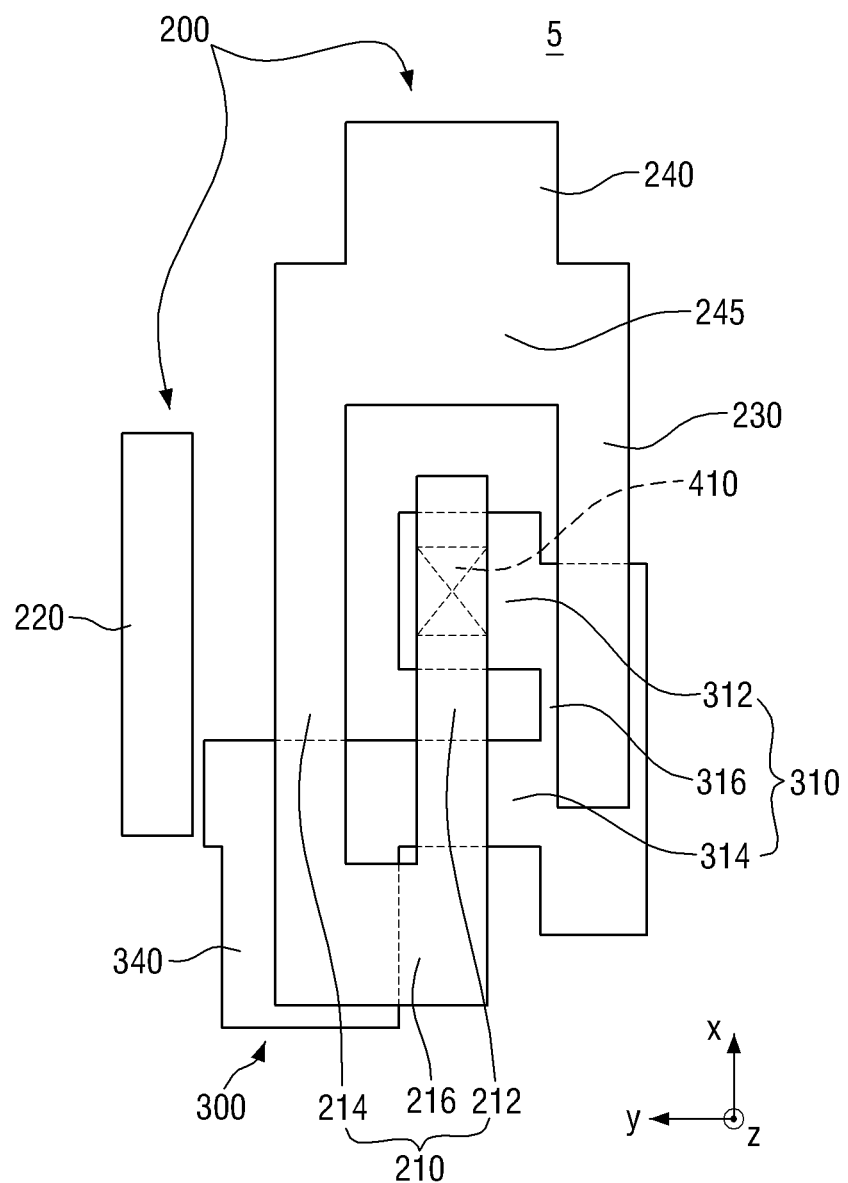
FIG. 12 is a schematic view illustrating an e-fuse structure according to a fifth embodiment of the present invention.
Figure 13:
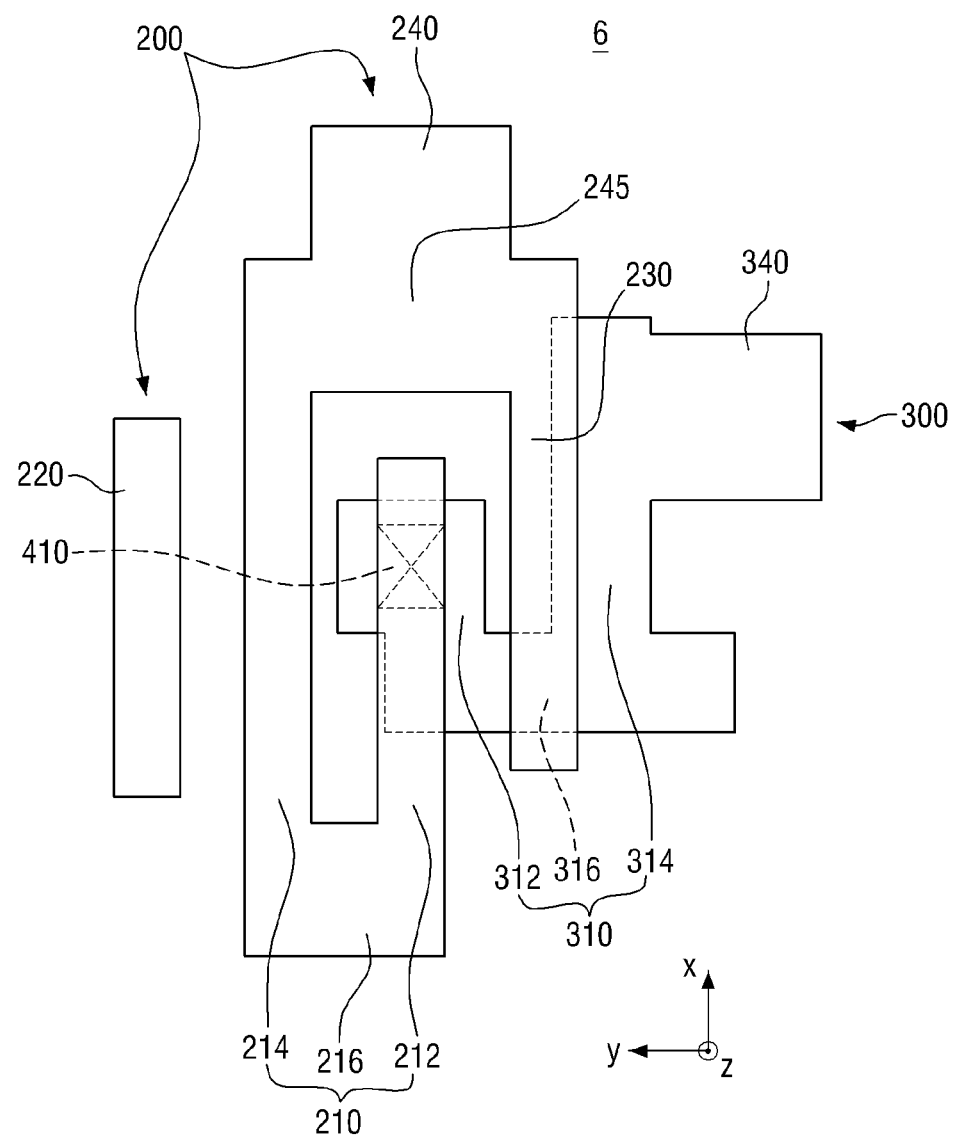
FIG. 13 is a schematic view illustrating an e-fuse structure according to a sixth embodiment of the present invention.

FIG. 11 is a schematic view illustrating an e-fuse structure according to a fourth embodiment of the present invention, FIG. 12 is a schematic view illustrating an e-fuse structure according to a fifth embodiment of the present invention, and FIG. 13 is a schematic view illustrating an e-fuse structure according to a sixth embodiment of the present invention. For the sake of convenient explanation, the following description will focus on differences between the e-fuse structures shown in FIGS. 4 to 6 and the e-fuse structures shown in FIGS. 11 to 13.

More specifically, FIG. 11 illustrates that the second metal pattern 300 shown in FIG. 4 is rotated 180° (e.g., flipped) about an axis extending in the second direction Y (e.g., an axis crossing the first via 410), FIG. 12 illustrates that the second metal pattern 300 shown in FIG. 4 is rotated 180° (e.g., flipped) about an axis extending in the first direction X (e.g., an axis crossing the first via 410), and FIG. 13 illustrates that the second metal pattern 300 shown in FIG. 4 is rotated counterclockwise 90° about an axis extending in the third direction Z (also described as a pivot point, which may be at a center of the first via 410 when viewed in a plan view).

Referring to FIG. 11, in the e-fuse structure 4 according to the fourth embodiment of the present invention, a first power supply connection part 240 and a second power supply connection part 340 are positioned at the same side of a first via 410 in the first direction X.

Referring to FIG. 12, in the e-fuse structure 5 according to the fifth embodiment of the present invention, a third part 316 of a second bent portion and a second part 214 of a first bent portion are positioned at opposite sides of the first via 410 in the second direction Y.

In addition, a third part 316 of the second bent portion and a first auxiliary pattern 220 are positioned at opposite sides of the first via 410 in the second direction Y.

Referring to FIG. 13, in the e-fuse structure 6 according to the sixth embodiment of the present invention, a second part 314 of a second bent portion extends in the first direction X. In addition, a third part 316 of the second bent portion extends in the second direction Y.

In FIG. 13, the second metal pattern 300 shown in FIG. 4 is rotated counterclockwise 90° about the third direction Z, but aspects of the present invention are not limited thereto. For example, the second metal pattern 300 shown in FIG. 4 may also be rotated clockwise 90° about the third direction Z.

Alternatively, the second metal pattern 300 shown in FIG. 4 may also be rotated counterclockwise 180° about the third direction Z.

Hereinafter, an e-fuse structure according to a seventh embodiment of the present invention will be described with reference to FIGS. 14 to 16. The seventh embodiment is substantially the same as the first embodiment shown in FIGS. 4 to 6, except for a third metal pattern, the same functional components are denoted by the same reference numerals as those of the previous embodiment and descriptions thereof will be briefly made or will not be made.

Figure 14:
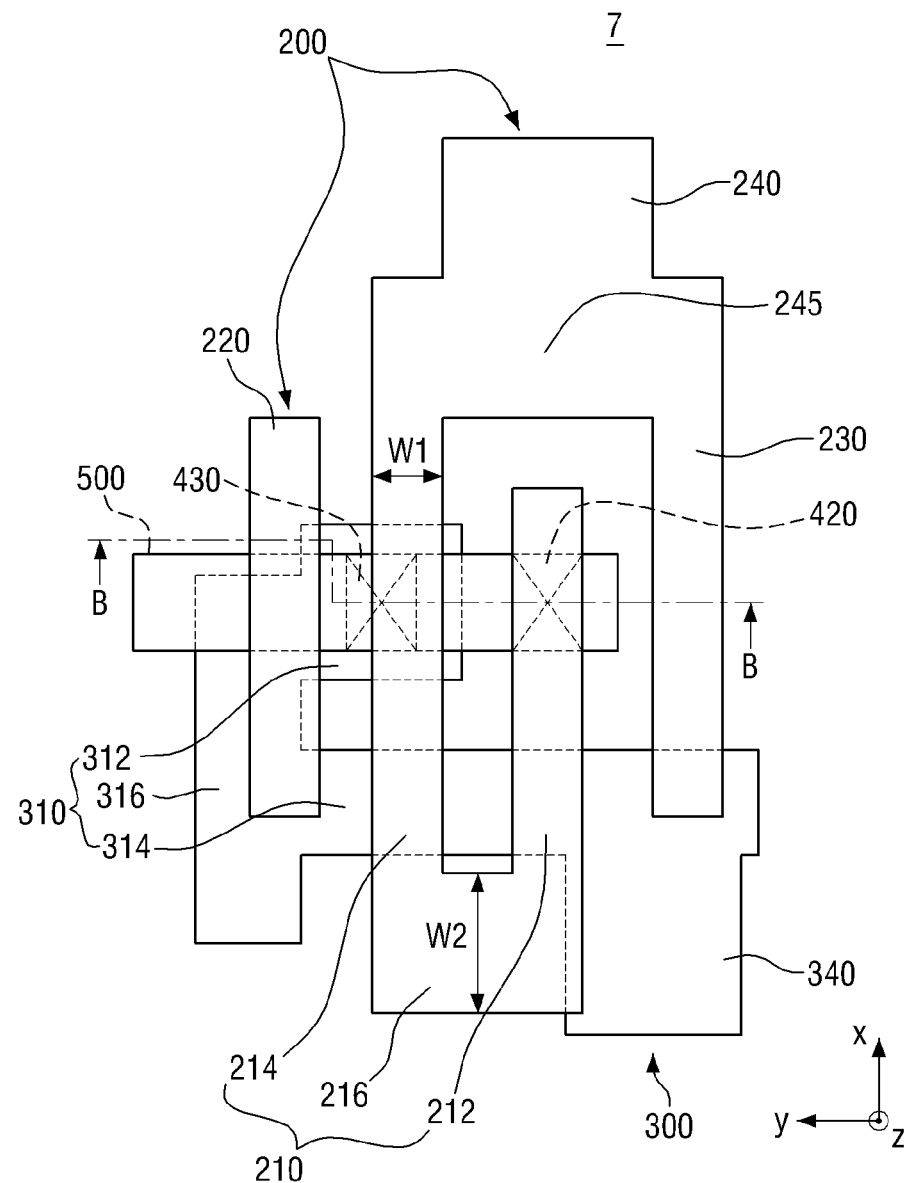
FIGS. 14 to 16 are schematic views illustrating an e-fuse structure according to a seventh embodiment of the present invention.
Figure 15:
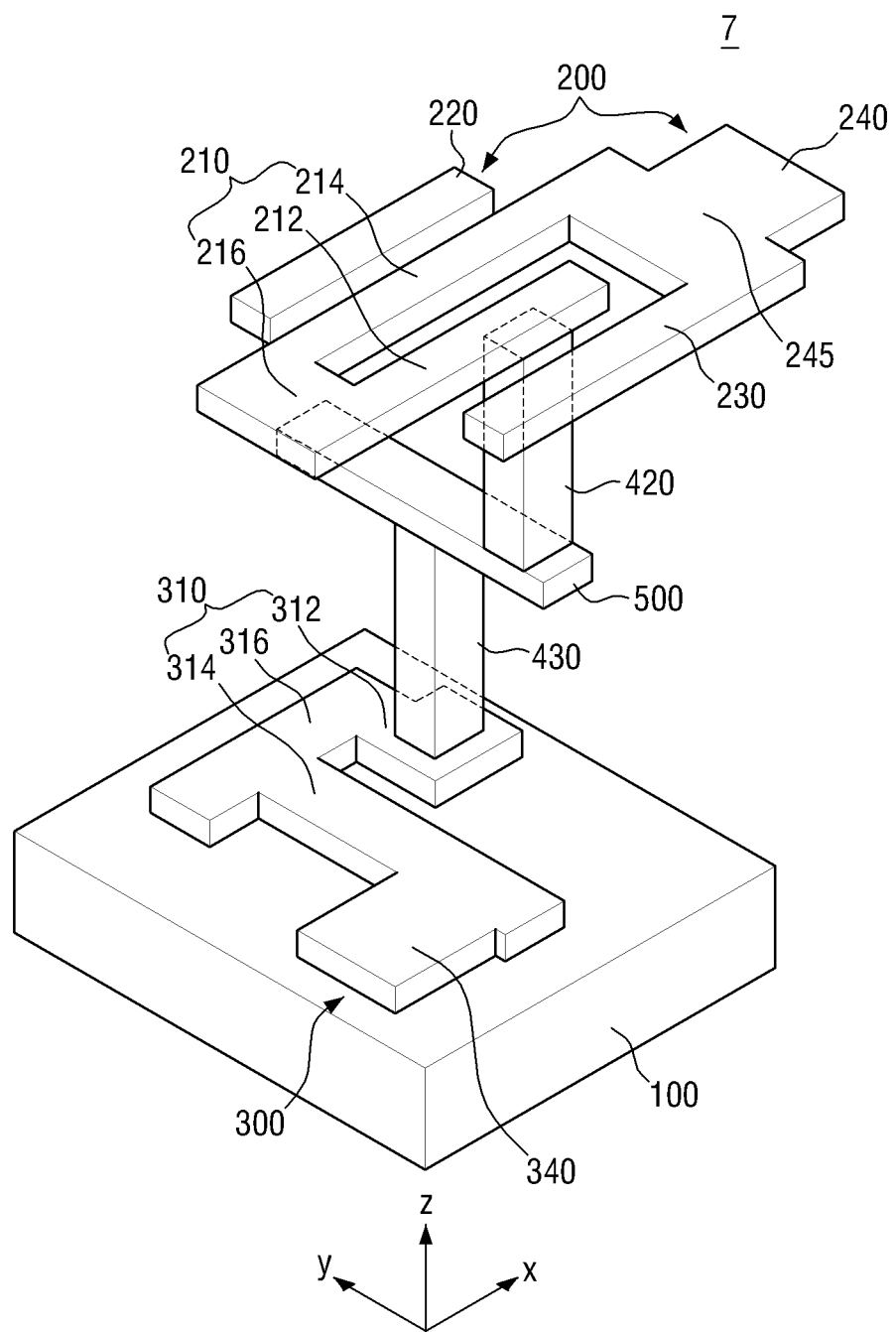
Figure 16:
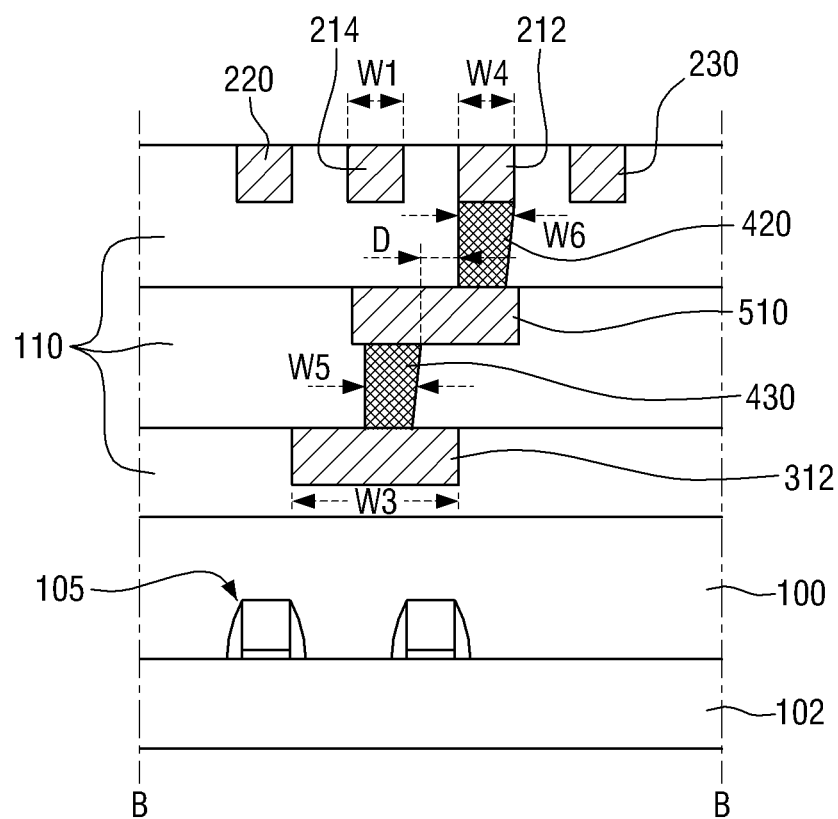

FIGS. 14 to 16 are schematic views illustrating an e-fuse structure according to a seventh embodiment of the present invention.

Specifically, FIG. 14 is a plan view of the e-fuse structure according to the seventh embodiment of the present invention, FIG. 15 is a perspective view of the e-fuse structure shown in FIG. 14, and FIG. 16 is a cross-sectional view taken along the line B-B of FIG. 14. For brevity, an interlayer insulation layer 110 is not illustrated in FIGS. 14 and 15.

Referring to FIGS. 14 to 16, the e-fuse structure 7 according to the seventh embodiment of the present invention may include a first metal pattern 200, a second metal pattern 300, a third metal pattern 500, a second via 420 and a third via 430.

The first metal pattern 200 is formed at a first metal level, or vertical level, the second metal pattern 300 is formed at a second metal level, or vertical level, different from the first metal/vertical level, and the third metal pattern 500 is formed at a third metal/vertical level between the first metal/vertical level and the second metal/vertical level.

The first metal level may be higher than the second metal level. In other words, a height ranging from a top surface of a substrate 102 to the first metal level having the first metal pattern 200 formed thereat is greater than a height ranging from the top surface of the substrate 102 to the second metal level having the second metal pattern 300 formed thereat. Therefore, the second metal level, the third metal level and the first metal level may be positioned sequentially from the top surface of the substrate 102 in that order.

In the e-fuse structure according to one embodiment of the present invention, the first metal pattern 200 is connected to the anode A shown in FIGS. 1 to 3 and a positive voltage is applied thereto, and the second metal pattern 300 is connected to the cathode C shown in FIGS. 1 to 3 and a negative voltage is applied thereto.

The first metal pattern 200 includes a first bent portion 210, a first auxiliary pattern 220, a second auxiliary pattern 230 and a first power supply connection part 240.

The first bent portion 210 includes a first part 212, a second part 214 and a third part 216. The first part 212 of the first bent portion and the second part 214 of the first bent portion extend in the first direction X and are formed to be parallel to each other so as to be adjacent to each other. The third part 216 of the first bent portion extends in the second direction Y. The third part 216 of the first bent portion connects the first part 212 of the first bent portion and the second part 214 of the first bent portion to electrically connect the first part 212 of the first bent portion and the second part 214 of the first bent portion.

The third part 216 of the first bent portion connecting one end of the first part 212 of the first bent portion and one end of the second part 214 of the first bent portion, which face each other, is illustrated in FIGS. 4 and 5, but aspects of the present invention are not limited thereto.

The first auxiliary pattern 220 extends in the first direction X and is formed to be adjacent with the second part 214 of the first bent portion. A side surface of the first auxiliary pattern 220 faces a side surface of the first part 212 of the first bent portion with the second part 214 of the first bent portion positioned between the first auxiliary pattern 220 and the first part 212 of the first bent portion.

The first auxiliary pattern 220 is spaced apart from the first bent portion 210 to then be electrically disconnected from the first bent portion 210.

The second auxiliary pattern 230 may extend in the first direction X. The second auxiliary pattern 230 may include a side surface facing a side surface of the second part 214 of the first bent portion with the first part 212 of the first bent portion between the second auxiliary pattern 230 and the second part 214 of the first bent portion.

The first power supply connection part 240 is connected to the second part 214 of the first bent portion through the extension pattern 245. The first power supply connection part 240 is connected to the anode A shown in FIGS. 1 to 3. One end of the second part 214 of the first bent portion that is not connected to the third part 216 of the first bent portion and one end of the second auxiliary pattern 230 may be connected to each other by the extension pattern 245.

The one end of the second part 214 of the first bent portion is connected to the first part 212 of the first bent portion and the other end of the second part 214 of the first bent portion is connected to the first power supply connection part 240.

While the one end of the second auxiliary pattern 230 is connected to the first power supply connection part 240, the other end of the second auxiliary pattern 230 is opened, so that a current does not flow in the second auxiliary pattern 230 even when a program current is supplied to the e-fuse structure 7. Even if the second auxiliary pattern 230 is not used as a path for the flow of current, heat integration is enhanced, thereby improving programming characteristics of the e-fuse structure 7.

The second metal pattern 300 may include a second bent portion 310 and a second power supply connection part 340.

The second bent portion 310 includes a first part 312, a second part 314 and a third part 316. The second part 314 of the second bent portion is positioned to be adjacent to the first part 312 of the second bent portion while including a side surface facing a side surface of the first part 312 of the second bent portion, and extends in the second direction Y.

The third part 316 of the second bent portion may connect the first part 312 of the second bent portion to the second part 314 of the second bent portion and may extend in the first direction X. For example, the third part 316 of the second bent portion may connect one end of the first part 312 of the second bent portion and one end of the second part 314 of the second bent portion, which include side surfaces facing each other.

The second power supply connection part 340 of the second metal pattern 300 is connected to the cathode C shown in FIGS. 1 to 3. The second power supply connection part 340 is connected to the second part 314 of the second bent portion. The second power supply connection part 340 may extend from the second part 314 of the second bent portion in the first direction X, but aspects of the present invention are not limited thereto.

In one embodiment, the third metal pattern 500 may extend in the second direction Y.

The third metal pattern 500 may be made of one or more selected, for example, from tungsten (W), aluminum (Al), copper (Cu) and a copper (Cu) alloy. Here, the copper (Cu) alloy may include C, Ag, Co, Ta, In, Sn, Zn, Mn, Ti, Mg, Cr, Ge, Sr, Pt, Mg, Al or Zr alloyed in Cu.

A barrier layer may further be formed between the third metal pattern 500 and the interlayer insulation layer 110 to prevent a metallic material constituting the third metal pattern 500 from being diffused into the interlayer insulation layer 110 around the third metal pattern 500. For example, the barrier layer may include one of Ta, TaN, TaSiN, Ti, TiN, TiSiN, W, WN and combinations thereof.

The second via 420 is formed between the first metal pattern 200 and the third metal pattern 500. The second via 420 connects the first metal pattern 200 to the third metal pattern 500.

In detail, the second via 420 connects the first metal pattern 200, specifically the first part 212 of the first bent portion, to the third metal pattern 500.

The third via 430 is formed between the second metal pattern 300 and the third metal pattern 500. The third via 430 connects the second metal pattern 300 to the third metal pattern 500.

In detail, the third via 430 connects the second metal pattern 300, specifically the first part 312 of the second bent portion, to the third metal pattern 500. The combination of the second via 420, the third metal pattern 500, and the third via 430 may be referred to herein as a via structure, or conductive via structure.

Since the third metal pattern 500 extends in the second direction Y, the second via 420 and the third via 430 connected to the third metal pattern 500 are arranged along the second direction Y.

A distance D between the second via 420 and the third via 430 connected to the third metal pattern 500 (e.g., in the Y direction) may be within a Blech length (e.g., equal to or less than a Blech length). The term "Blech length" used herein may mean a lower limit for electromigration to be caused.

For example, when the distance D between the second via 420 and the third via 430 connected to the third metal pattern 500 is within a Blech length of the third metal pattern 500, electromigration is not caused between the second via 420 and the third via 430. In other words, a void or hill-lock due to electromigration is not created in the third metal pattern 500.

Each of the second via 420 and the third via 430 may be made of one or more selected, for example, from tungsten (W), aluminum (Al), copper (Cu) and a copper (Cu) alloy. Here, the copper (Cu) alloy may include C, Ag, Co, Ta, In, Sn, Zn, Mn, Ti, Mg, Cr, Ge, Sr, Pt, Mg, Al or Zr alloyed in Cu.

A barrier layer may further be formed between the second via 420 and the interlayer insulation layer 110 and/or between the third via 430 and the interlayer insulation layer 110 to prevent a metallic material constituting the second via 420 and/or the third via 430 from being diffused into the interlayer insulation layer 110 around the third metal pattern 500. For example, the barrier layer may include one of Ta, TaN, TaSiN, Ti, TiN, TiSiN, W, WN and combinations thereof.

A width of the first part 212 of the first bent portion may be a first width W4, a width of the second part 214 of the first bent portion may be a second width W1, a width of the third part 216 of the first bent portion may be a third width W2, and a width of the first part 312 of the second bent portion may be a fourth width W3. The width W4 of the first part 212 of the first bent portion, the width W1 of the second part 214 of the first bent portion and the width W3 of the first part 312 of the second bent portion may mean widths in the second direction Y, and the width W2 of the third part 216 of the first bent portion may mean a width in the first direction X.

In addition, a width of the second via 420 is a fifth width W6, and a width of the third via 430 is a sixth width W5. In FIGS. 14 and 16, the width W6 of the second via 420 and the width W5 of the third via 430 are widths in the second direction Y, which is, however, provided only for illustration, but aspects of the present invention are not limited thereto. For example, the width W6 of the second via 420 and the width W5 of the third via 430 may also be widths in the first direction X. In the following description, it is assumed that the width W6 of the second via 420 and the width W5 of the third via 430 are the widths in the second direction Y.

In the e-fuse structure 7 according to the seventh embodiment of the present invention, the width W4 of the first part 212 of the first bent portion is greater than the width W1 of the second part 214 of the first bent portion. In addition, the width W2 of the third part 216 of the first bent portion is greater than the width W1 of the second part 214 of the first bent portion. That is to say, the width W1 of the second part 214 in the first bent portion may have the smallest value.

In addition, in the e-fuse structure 7 according to the seventh embodiment of the present invention, the width W3 of the first part 312 of the second bent portion is greater than the width W4 of the first part 212 of the first bent portion.

In the e-fuse structure 7 according to the seventh embodiment of the present invention, the width W5 of the third via 430 is equal to the width W6 of the second via 420 or greater than the width W6 of the second via 420.

Since the third via 430 is connected to the first part 312 of the second bent portion, the width W3 of the first part 312 of the second bent portion may be greater than the width W5 of the third via 430. Since the second via 420 is connected to the first part 212 of the first bent portion, the width W6 of the second via 420 and the width W4 of the first part 212 of the first bent portion may be substantially equal to each other.

When a program current is supplied to the e-fuse structure, in terms of a width of a path for migration of electrons between the cathode C and the anode A, the width W3 of the first part 312 of the second bent portion is greater than the width W5 of the third via 430. The width W5 of the third via 430 is equal to the width W6 of the second via 420 or greater than the width W6 of the second via 420. The width W6 of the second via 420 and the width W4 of the first part 212 of the first bent portion are substantially equal to each other. The width W4 of the first part 212 of the first bent portion is greater than the width W1 of the second part 214 of the first bent portion.

In the e-fuse structure 7 according to the seventh embodiment of the present invention, the second part 214 of the first bent portion may be a region where a void is created when a program current is supplied, which will be described in detail with reference to FIG. 32.

In FIG. 14, the third via 430 is positioned between the second via 420 and the first auxiliary pattern 220, but aspects of the present invention are not limited thereto. For example, the second metal pattern 300 may move in the second direction Y, so that the second via 420 is positioned between the third via 430 and the second auxiliary pattern 230.

Next, e-fuse structures according to eighth and ninth embodiments of the present invention will be described with reference to FIGS. 17 to 20.

Figure 17:
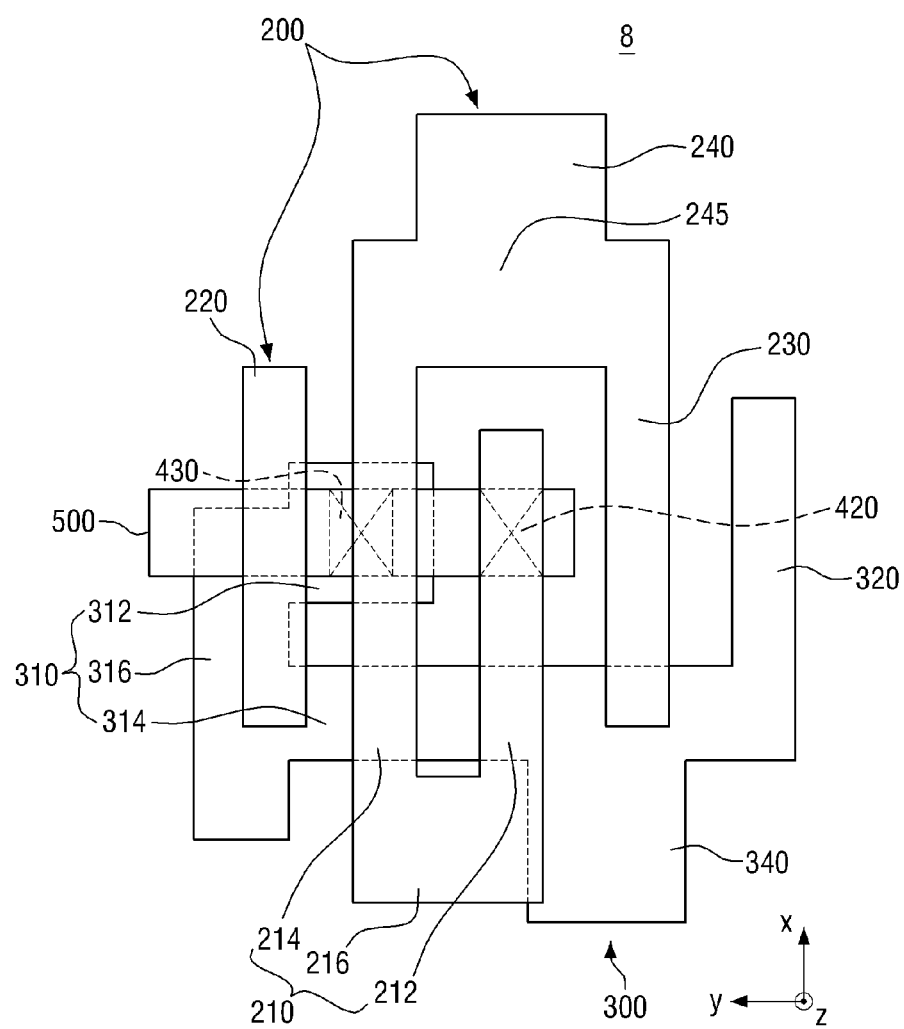
FIGS. 17 and 18 are schematic views illustrating an e-fuse structure according to an eighth embodiment of the present invention.
Figure 18:
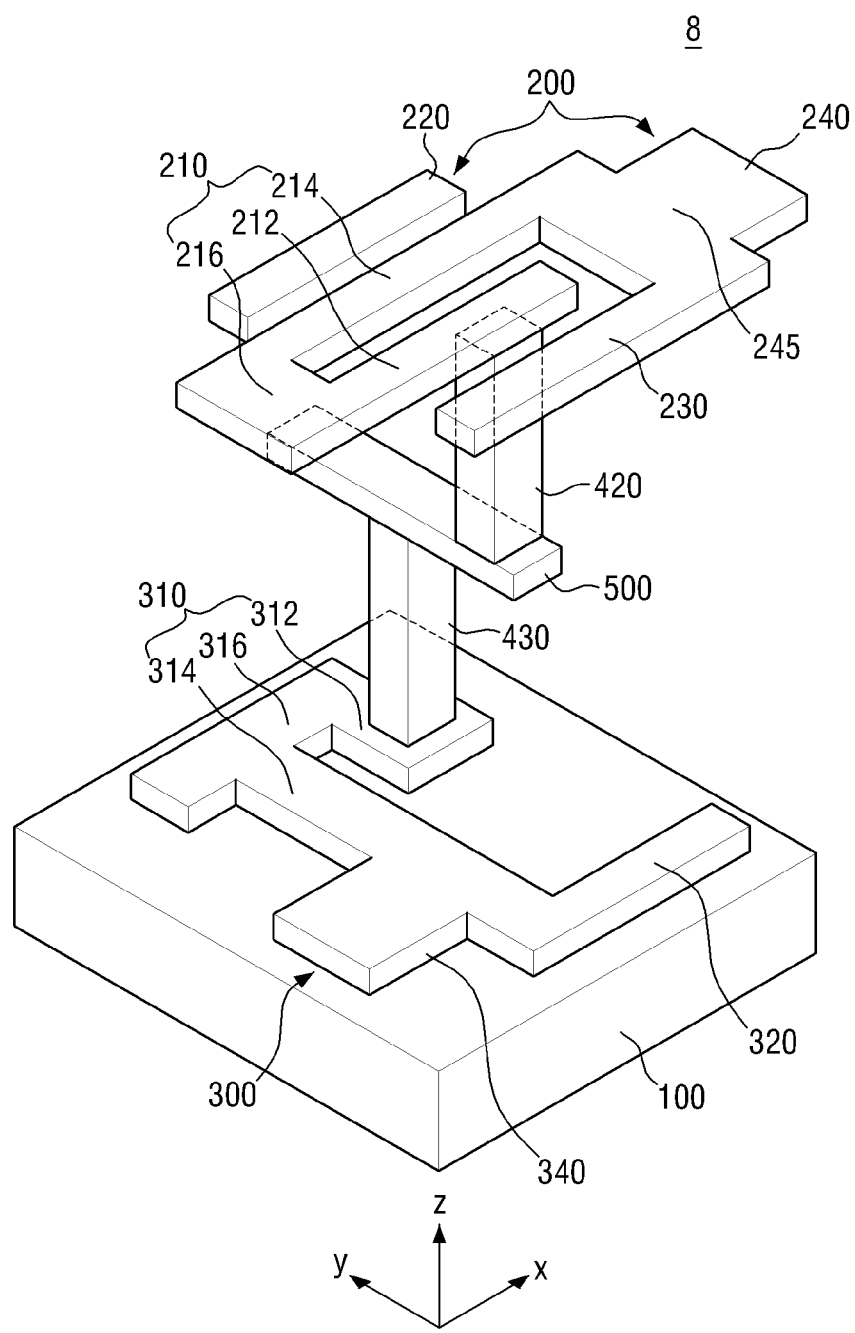
Figure 19:
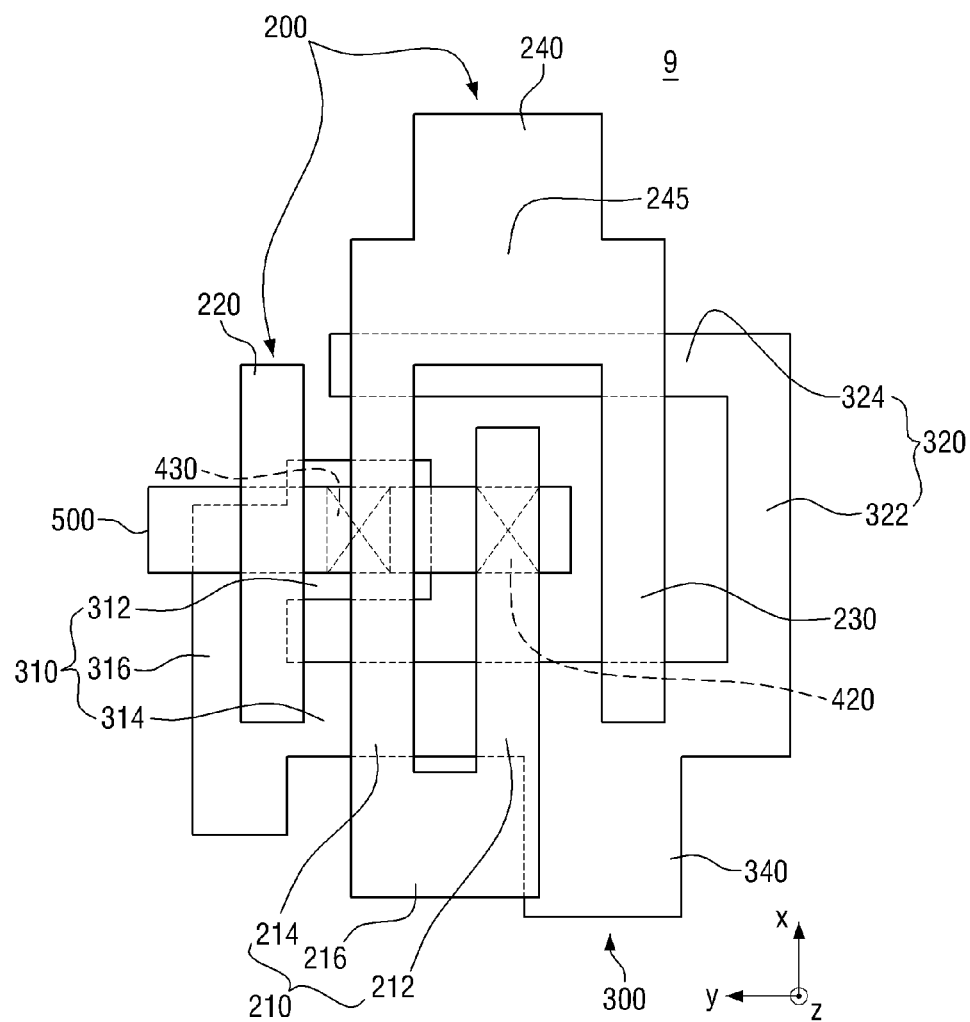
FIGS. 19 and 20 are schematic views illustrating an e-fuse structure according to a ninth embodiment of the present invention.
Figure 20:
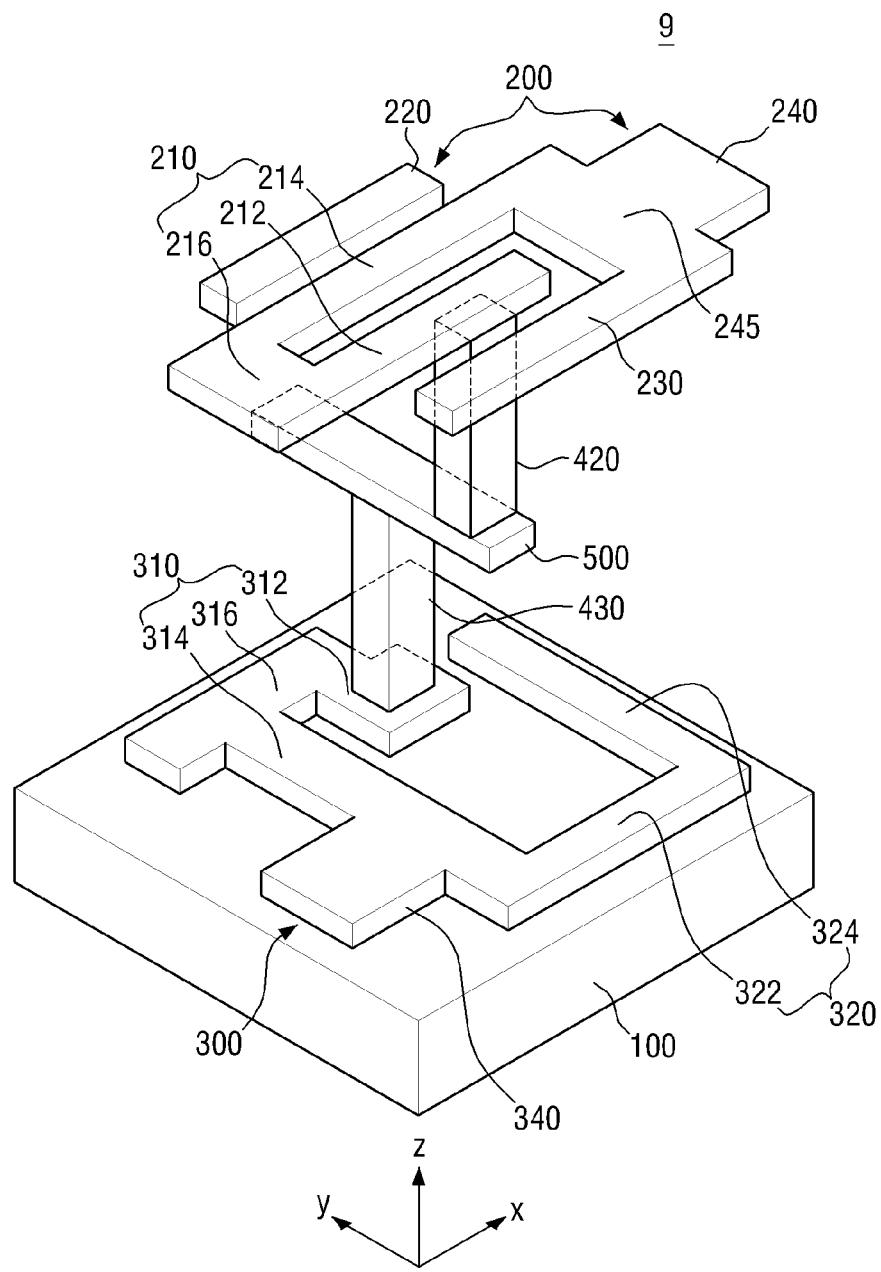

FIGS. 17 and 18 are schematic views illustrating an e-fuse structure according to an eighth embodiment of the present invention and FIGS. 19 and 20 are schematic views illustrating an e-fuse structure according to a ninth embodiment of the present invention. For the sake of convenient explanation, the following description will focus on differences between the e-fuse structures shown in FIGS. 14 to 16 and the e-fuse structures shown in FIGS. 17 and 18.

Referring to FIGS. 17 and 18, in the e-fuse structure 8 according to the eighth embodiment of the present invention, a second metal pattern 300 further includes a third auxiliary pattern 320.

The third auxiliary pattern 320 extends in the first direction X. A side surface of the third auxiliary pattern 320 faces a side surface of the third part 316 of the second bent portion with the first part 312 of the second bent portion and the second part 314 of the second bent portion positioned between the third auxiliary pattern 320 and the third part 316 of the second bent portion. The third auxiliary pattern 320 may be connected to the second part 314 of the second bent portion, but aspects of the present invention are not limited thereto.

Referring to FIGS. 19 and 20, in the e-fuse structure 9 according to the ninth embodiment of the present invention, a second metal pattern 300 further includes a third auxiliary pattern 320 including a first part 322 and a second part 324.

The first part 322 of the third auxiliary pattern 320 extends in the first direction X. The second part 324 of the third auxiliary pattern 320 extends in the second direction Y. A side surface of the first part 322 of the third auxiliary pattern 320 faces a side surface of the third part 316 of the second bent portion and is formed to be parallel with the second part 314 of the second bent portion with the first part 312 of the second bent portion and the second part 314 of the second bent portion positioned between the first part 322 of the third auxiliary pattern 320 and the third part 316 of the second bent portion.

In FIGS. 19 and 20, the third auxiliary pattern 320 is connected to the second bent portion 310, but aspects of the present invention are not limited thereto. In addition, the first part 322 of the third auxiliary pattern 320 is connected to the second part 324 of the third auxiliary pattern 320, but aspects of the present invention are not limited thereto.

Next, e-fuse structures according to tenth and eleventh embodiments of the present invention will be described with reference to FIGS. 21 to 24.

Figure 21:
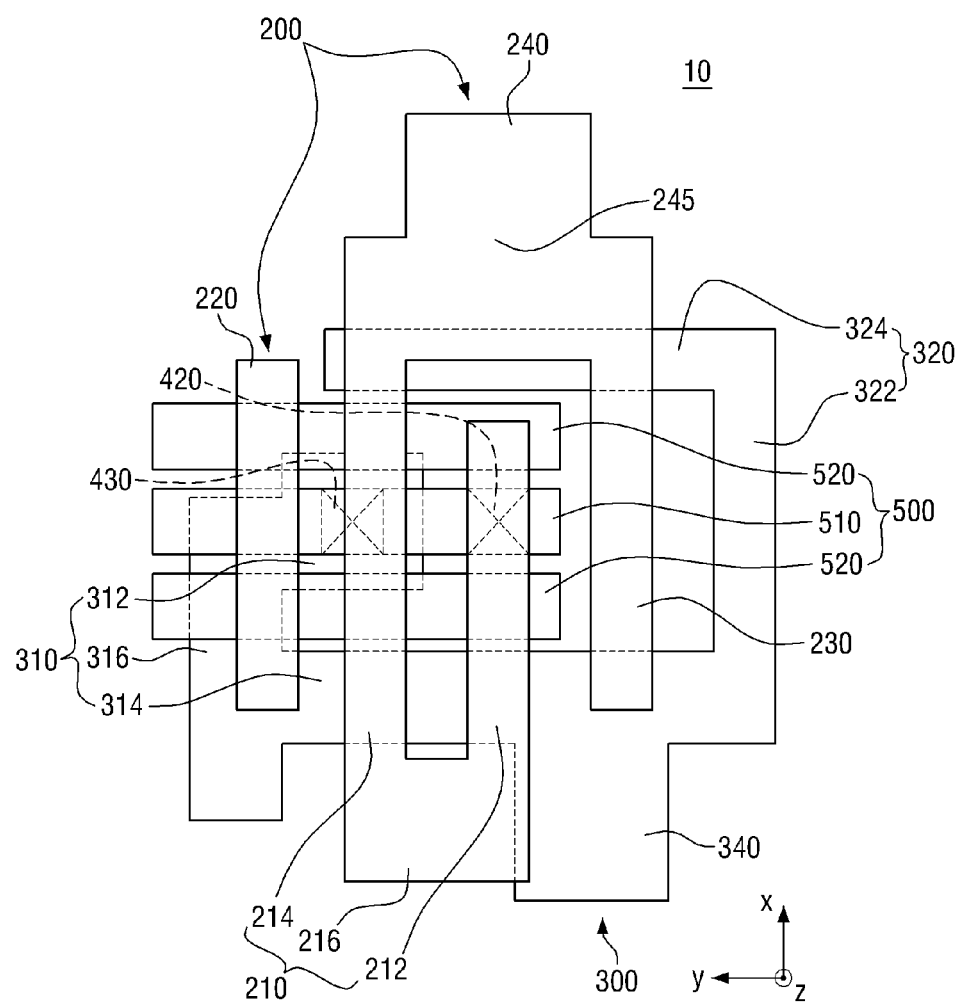
FIGS. 21 and 22 are schematic views illustrating an e-fuse structure according to a tenth embodiment of the present invention.
Figure 22:
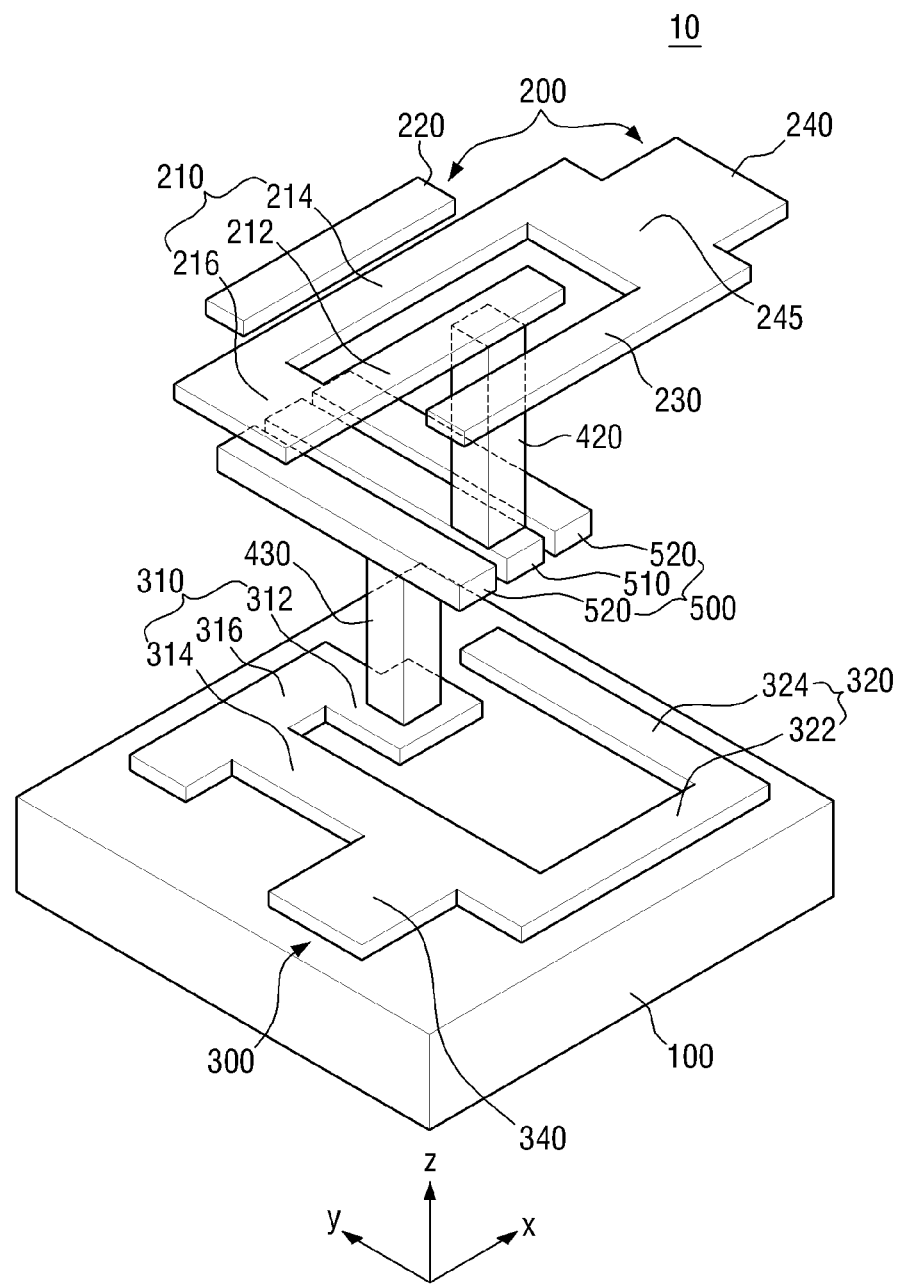
Figure 23:
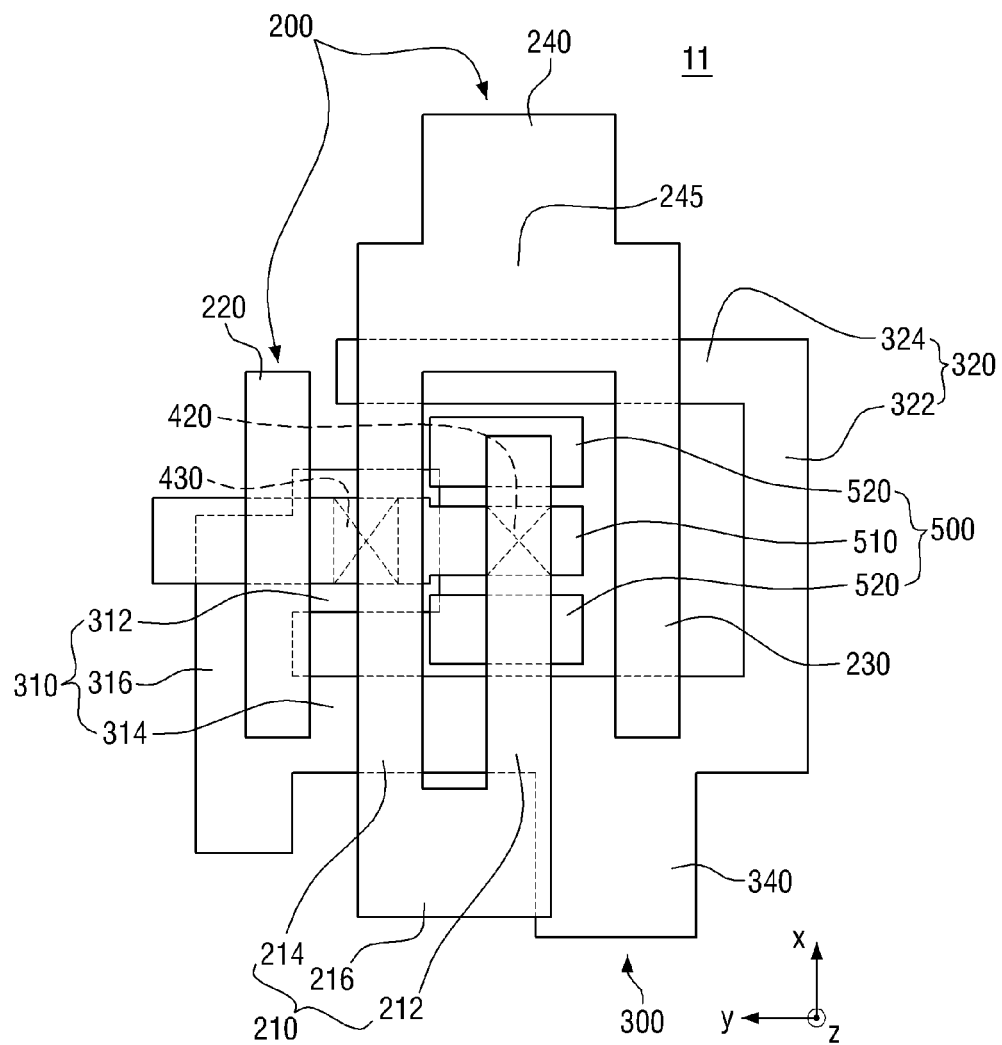
FIGS. 23 and 24 are schematic views illustrating an e-fuse structure according to an eleventh embodiment of the present invention.
Figure 24:
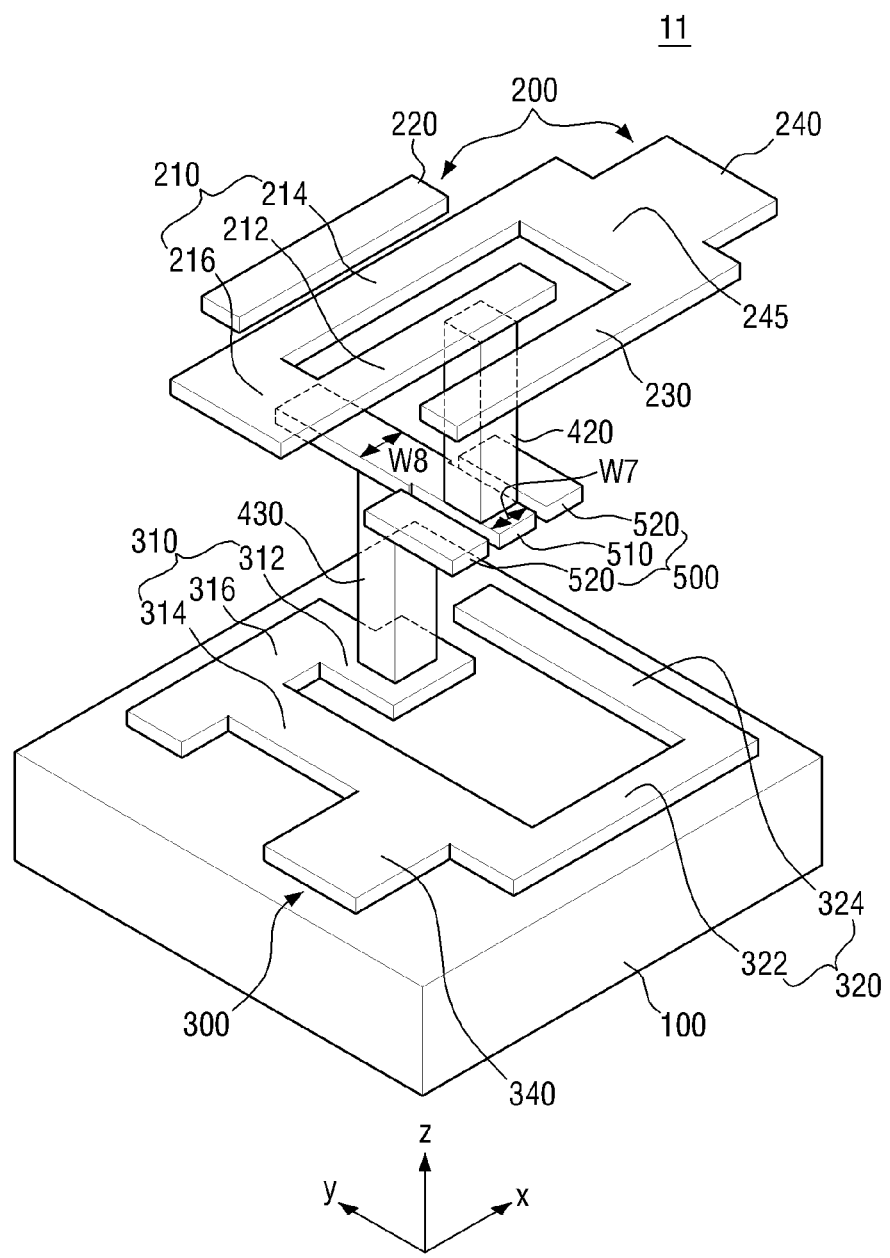

FIGS. 21 and 22 are schematic views illustrating an e-fuse structure according to a tenth embodiment of the present invention and FIGS. 23 and 24 are schematic views illustrating an e-fuse structure according to an eleventh embodiment of the present invention.

For the sake of convenient explanation, the following description will focus on differences between the e-fuse structures shown in FIGS. 19 and 20 and the e-fuse structures shown in FIGS. 21 and 22.

Referring to FIGS. 21 and 22, in the e-fuse structure 10 according to the tenth embodiment of the present invention, a third metal pattern 500 includes a connection pattern 510 and fourth auxiliary patterns 520.

The connection pattern 510 extends in the second direction Y. The fourth auxiliary patterns 520 are formed at opposite sides of the connection pattern 510. The fourth auxiliary patterns 520 may extend in the second direction Y and may be formed to be parallel with the connection pattern 510.

A second via 420 and a third via 430 are connected to the connection pattern 510. The combination of the second via 420, third via 430, and connection pattern 510 described in the various embodiments herein may be referred to as a via structure, or conductive via structure. For example, in one embodiment, the connection pattern 510 is electrically connected to a first bent portion 210 of a first metal pattern 200 and a second bent portion 310 of a second metal pattern 300.

In FIGS. 21 and 22, the fourth auxiliary pattern 520 is electrically disconnected from the connection pattern 510, but aspects of the present invention are not limited thereto.

In the e-fuse structure 10 according to the tenth embodiment of the present invention, the second via 420 and the third via 430 connected to the connection pattern 510 are positioned between the fourth auxiliary patterns 520. In other words, the fourth auxiliary pattern 520 are positioned at the opposite sides of the second via 420 in the first direction X and are positioned at the opposite sides of the third via 430 in the first direction X.

The fourth auxiliary patterns 520 may reduce a width of the connection pattern 510 positioned between the fourth auxiliary patterns 520. For example, since the fourth auxiliary patterns 520 are formed at the opposite sides of the connection pattern 510, it is possible to prevent the width of the connection pattern 510 from increasing.

In addition, the fourth auxiliary patterns 520 prevent Joule's heat generated from the connection pattern 510 from being rapidly propagated to the vicinity of the e-fuse structure, thereby enhancing heat integration in the e-fuse structure.

Referring to FIGS. 23 and 24, in the e-fuse structure 11 according to an eleventh embodiment of the present invention, a third metal pattern 500 includes a connection pattern 510 and fourth auxiliary patterns 520.

The connection pattern 510 extends in the second direction Y. The fourth auxiliary patterns 520 are formed at opposite sides of a portion of the connection pattern 510 so as to be parallel with the connection pattern 510. A second via 420 and a third via 430 are connected to the connection pattern 510.

In the e-fuse structure 11 according to an eleventh embodiment of the present invention, the second via 420 connected to the connection pattern 510 is positioned between the fourth auxiliary patterns 520 along a Z axis, while the third via 430 connected to the connection pattern 510 is not positioned between the fourth auxiliary patterns 520 along the same Z axis. In other words, the fourth auxiliary patterns 520 are positioned at opposite sides of the second via 420 in the first direction X (along the Z axis) but are not positioned at opposite sides of the third via 430 in the first direction X (along the same Z axis).

A width of a portion of the connection pattern 510 connected to the second via 420 may be a seventh width W7, and a width of a portion of the connection pattern 510 connected to the third via 430 may be an eighth width W8. The width W7 of the portion of the connection pattern 510 connected to the second via 420 and the width W8 of the connection pattern 510 connected to the third via 430 may mean widths in a different direction from a direction in which the connection pattern 510 extends. For example, in the e-fuse structure 11 according to the eleventh embodiment of the present invention, the width W7 of the portion of the connection pattern 510 connected to the second via 420 and the width W8 of the connection pattern 510 connected to the third via 430 may mean widths in the first direction X.

In the e-fuse structure 11 according to the eleventh embodiment of the present invention, connection pattern 510, the width W7 of the portion of the connection pattern 510 connected to the second via 420 is smaller than the width W8 of the connection pattern 510 connected to the third via 430. Since the fourth auxiliary patterns 520 are positioned at opposite sides of the portion of the connection pattern 510 connected to the second via 420, the width of the portion of the connection pattern 510 connected to the second via 420 is prevented from increasing during a photolithography process for forming the connection pattern 510.

Next, e-fuse structures according to twelfth to fourteenth embodiments of the present invention will be described with reference to FIGS. 25 to 30.

Figure 25:
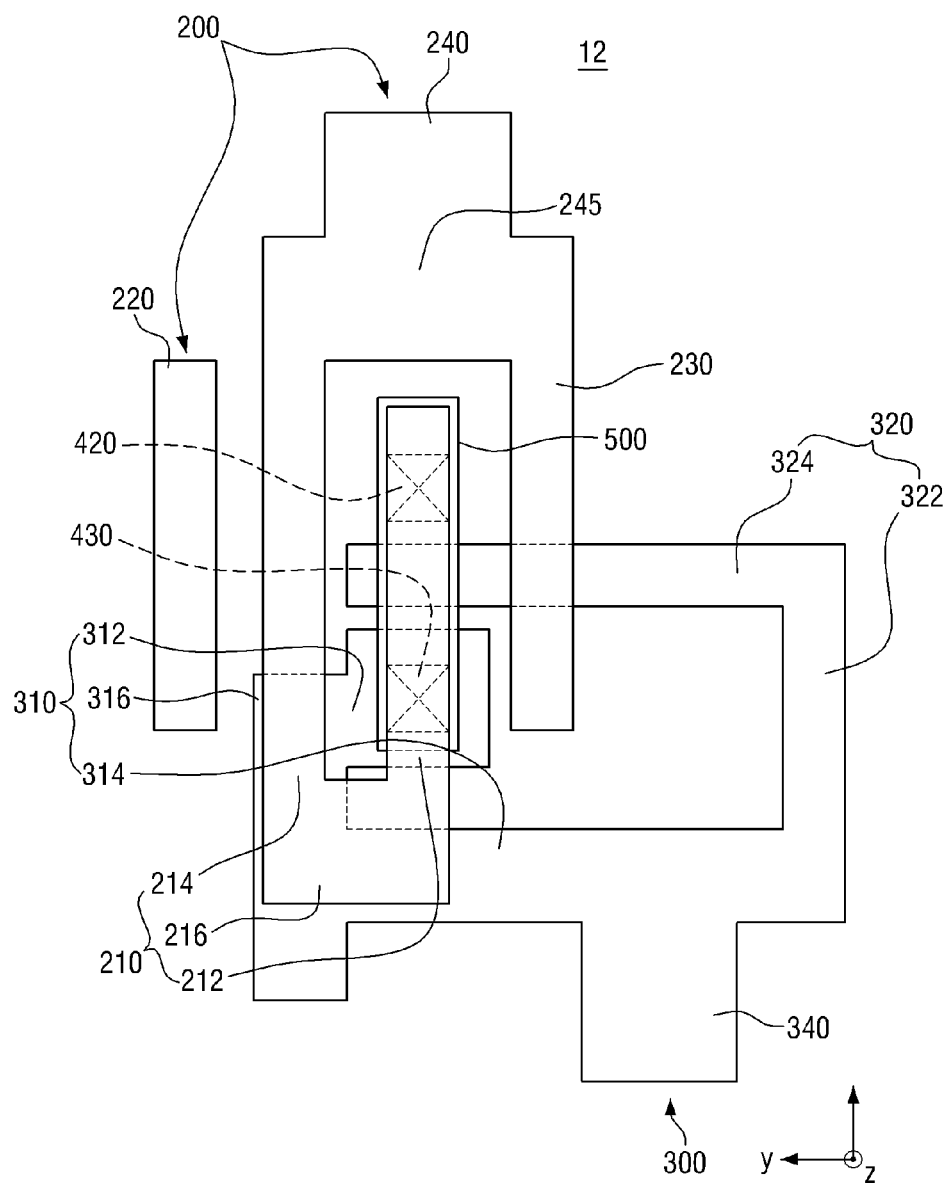
FIGS. 25 and 26 are schematic views illustrating an e-fuse structure according to a twelfth embodiment of the present invention.
Figure 26:
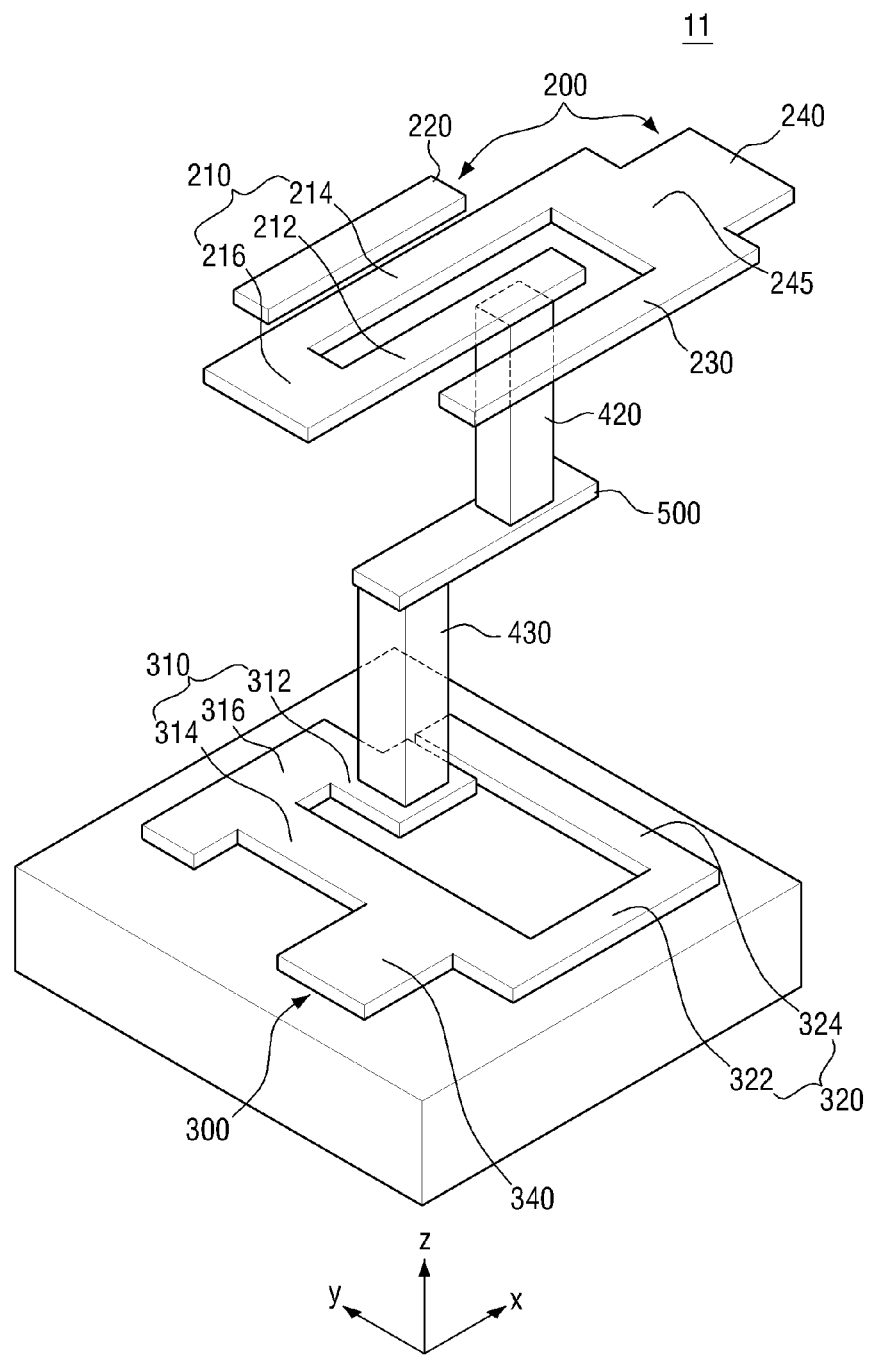
Figure 27:
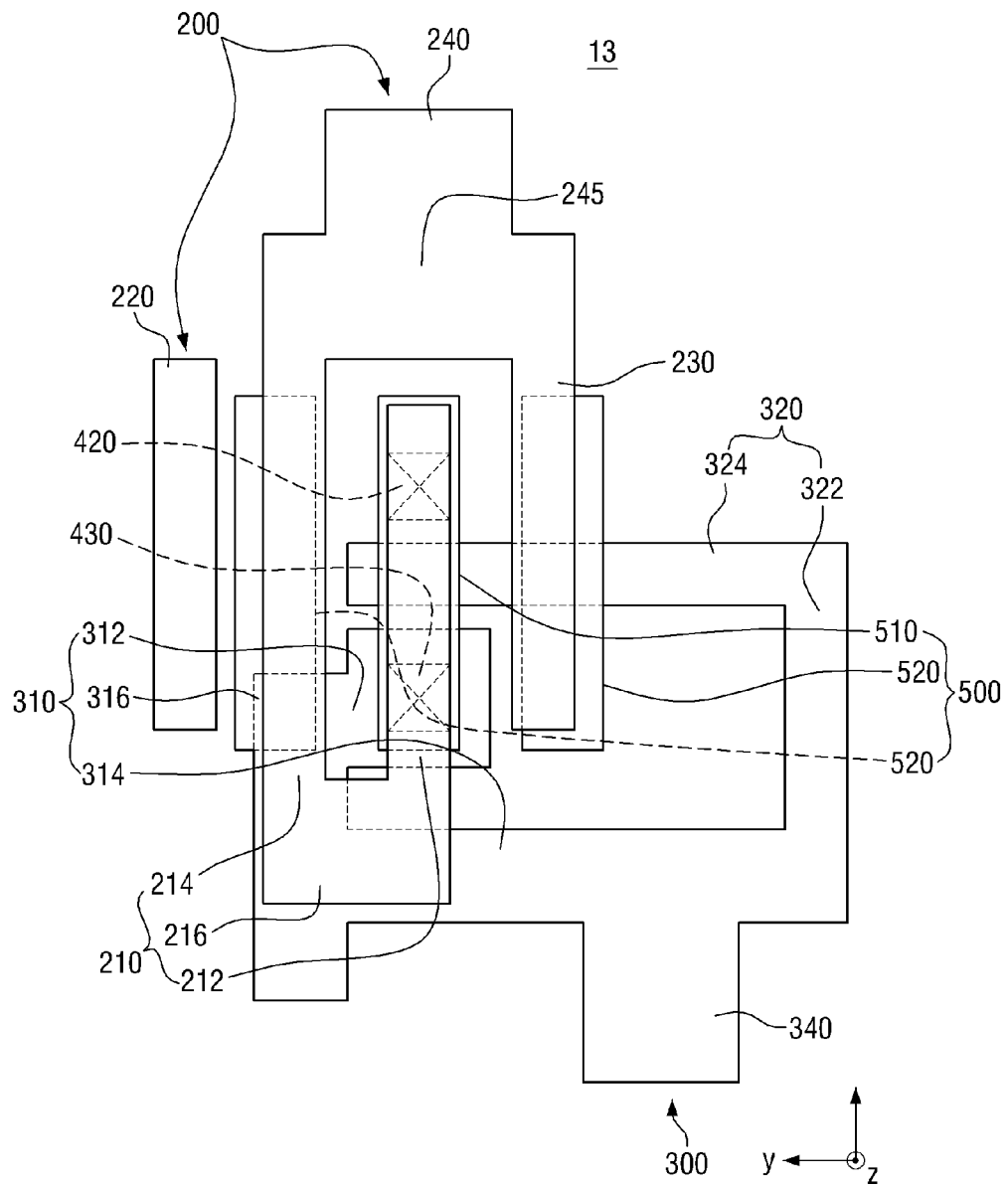
FIGS. 27 and 28 are schematic views illustrating an e-fuse structure according to a thirteenth embodiment of the present invention.
Figure 28:
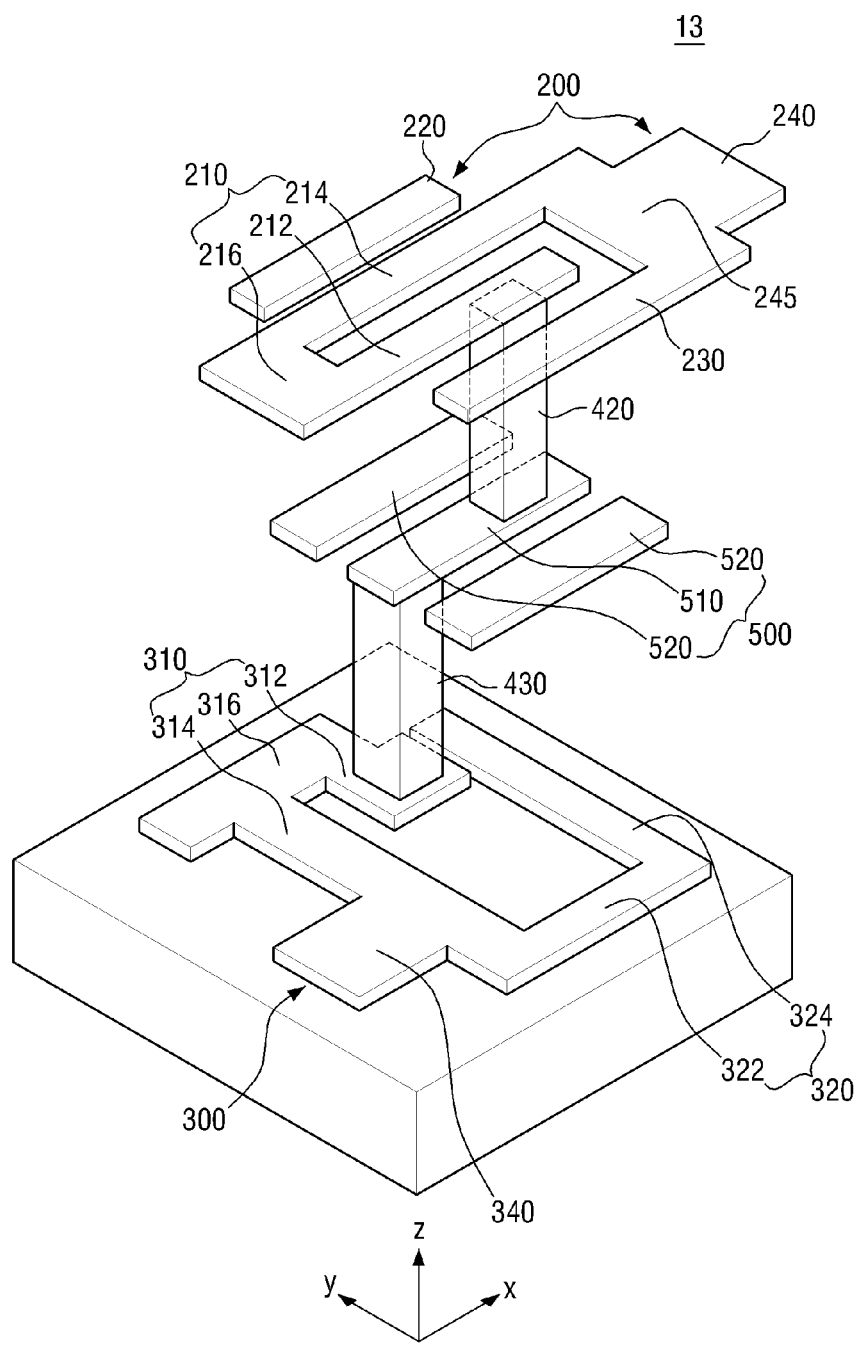
Figure 29:
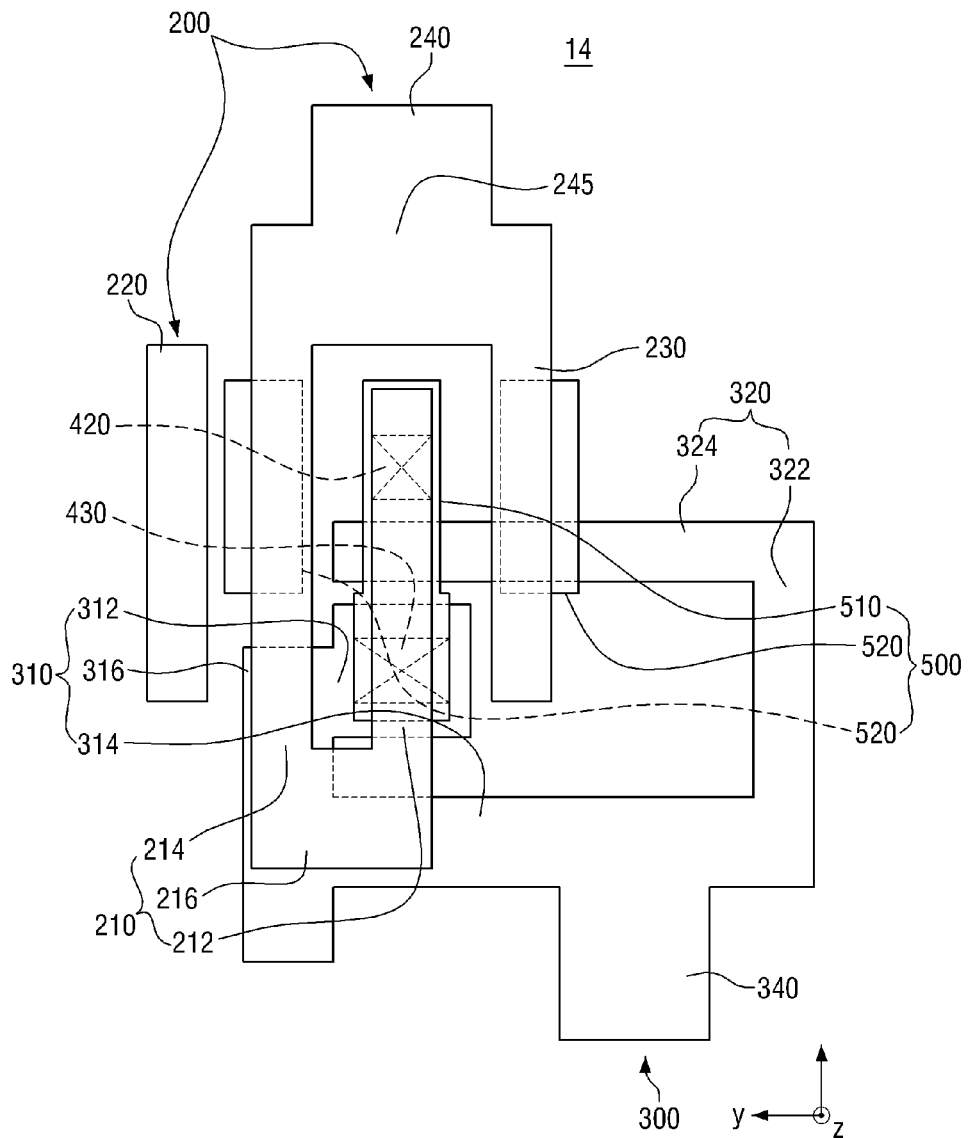
FIGS. 29 and 30 are schematic views illustrating an e-fuse structure according to a fourteenth embodiment of the present invention.
Figure 30:
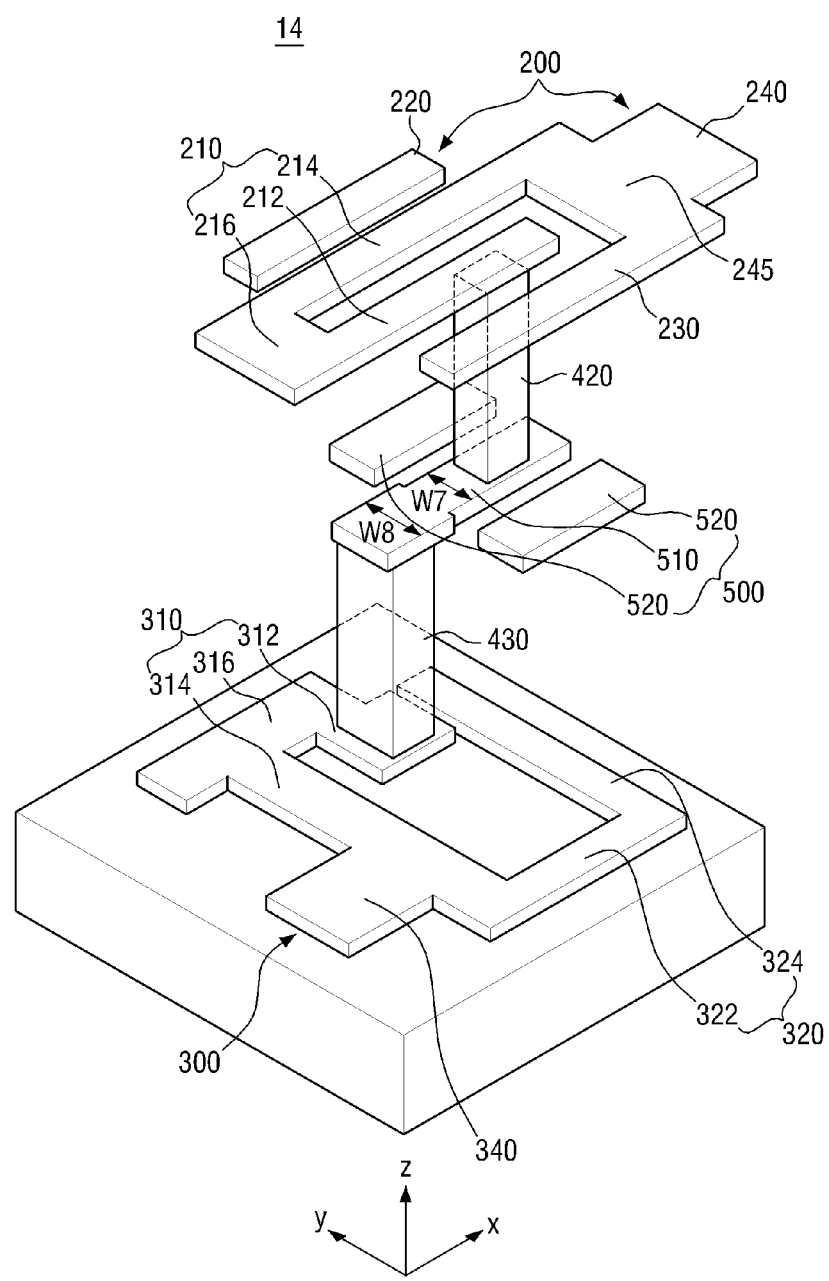

FIGS. 25 and 26 are schematic views illustrating an e-fuse structure according to a twelfth embodiment of the present invention, FIGS. 27 and 28 are schematic views illustrating an e-fuse structure according to a thirteenth embodiment of the present invention and FIGS. 29 and 30 are schematic views illustrating an e-fuse structure according to a fourteenth embodiment of the present invention. For the sake of convenient explanation, the following description will focus on differences between the e-fuse structures shown in FIGS. 19 and 20 and the e-fuse structures shown in FIGS. 25 and 26.

Referring to FIGS. 25 and 26, in the e-fuse structure 12 according to the twelfth embodiment of the present invention, a third metal pattern 500 extends in a first direction X.

Since the third metal pattern 500 extends in the first direction X, a second via 420 and a third via 430 connected to the third metal pattern 500 are arranged along the first direction X.

In FIG. 25, from the viewpoint of a plane, the third via 430 is positioned to be nearer to a third part 216 of a first bent portion than the second via 420, but aspects of the present invention are not limited thereto. For example, since the second metal pattern 300 moves in the first direction X, the second via 420 may be positioned to be nearer to the third part 216 of the first bent portion than the third via 430.

Referring to FIGS. 27 and 28, in the e-fuse structure 13 according to the thirteenth embodiment of the present invention, a third metal pattern 500 includes a connection pattern 510 extending in the first direction X and fourth auxiliary patterns 520 formed at opposite sides of the connection pattern 510.

The fourth auxiliary patterns 520 may extend in the first direction X and may be formed to be parallel to the connection pattern 510.

The second via 420 and the third via 430 are connected to the connection pattern 510. For example, the connection pattern 510 is electrically connected to a first bent portion 210 of a first metal pattern 200 and a second bent portion 310 of a second metal pattern 300.

In the e-fuse structure 12 according to the twelfth embodiment of the present invention, the second via 420 and the third via 430 connected to the connection pattern 510 are positioned between the fourth auxiliary patterns 520. In other words, the fourth auxiliary patterns 520 are positioned at opposite sides of the second via 420 in the second direction Y and are positioned at opposite sides of the third via 430 in the second direction Y.

Referring to FIGS. 29 and 30, in the e-fuse structure 14 according to the fourteenth embodiment of the present invention, a third metal pattern 500 includes a connection pattern 510 extending in the first direction X and fourth auxiliary patterns 520 formed at opposite sides of a portion of the connection pattern 510.

The fourth auxiliary patterns 520 may extend in the first direction X and may be formed to be parallel with the portion of the connection pattern 510.

In the e-fuse structure 14 according to the fourteenth embodiments of the present invention, a second via 420 connected to the connection pattern 510 is positioned between the fourth auxiliary patterns 520, while a third via 430 connected to the connection pattern 510 is not positioned between the fourth auxiliary patterns 520. In other words, the fourth auxiliary patterns 520 are positioned at opposite sides of the second via 420 in the second direction Y but are not positioned at opposite sides of the third via 430 in the second direction Y.

Figure 31:
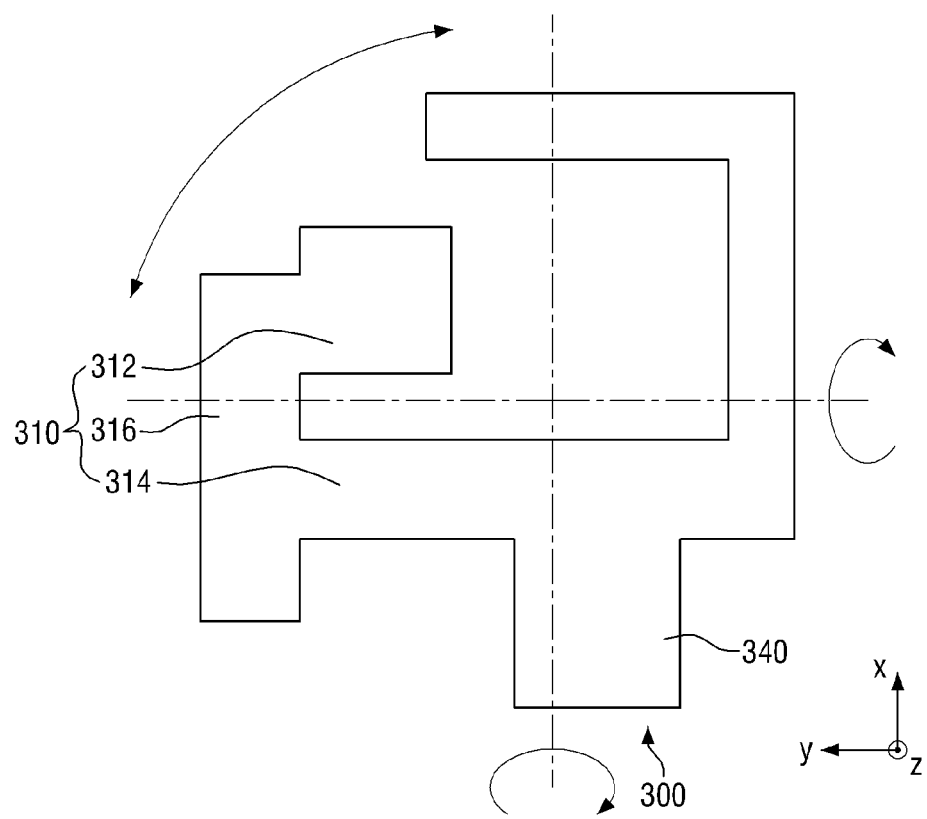
FIG. 31 is a schematic diagram illustrating modified examples of the seventh to fourteenth embodiments of the present invention.

FIG. 31 is a schematic diagram illustrating modified examples of the seventh to fourteenth embodiments of the present invention.

Referring to FIG. 31, in the e-fuse structures 7-14 according to the embodiments of the present invention, the second metal pattern 300 may be rotated about the first direction X, the second direction Y and the third direction Z, respectively.

For example, the second metal pattern 300 may be rotated 180° about an axis extending in the first direction X to become a combination of the first metal pattern 200 and the third metal pattern 500 shown in FIGS. 14 to 30. The second metal pattern 300 may be rotated 180° about an axis extending in the second direction Y to become a combination of the first metal pattern 200 and the third metal pattern 500 shown in FIGS. 14 to 30.

In addition, the second metal pattern 300 may be rotated clockwise or counterclockwise 90° or 180° about an axis extending in the third direction Z to become a combination of the first metal pattern 200 and the third metal pattern 500 shown in FIGS. 14 to 30.

Figure 32:
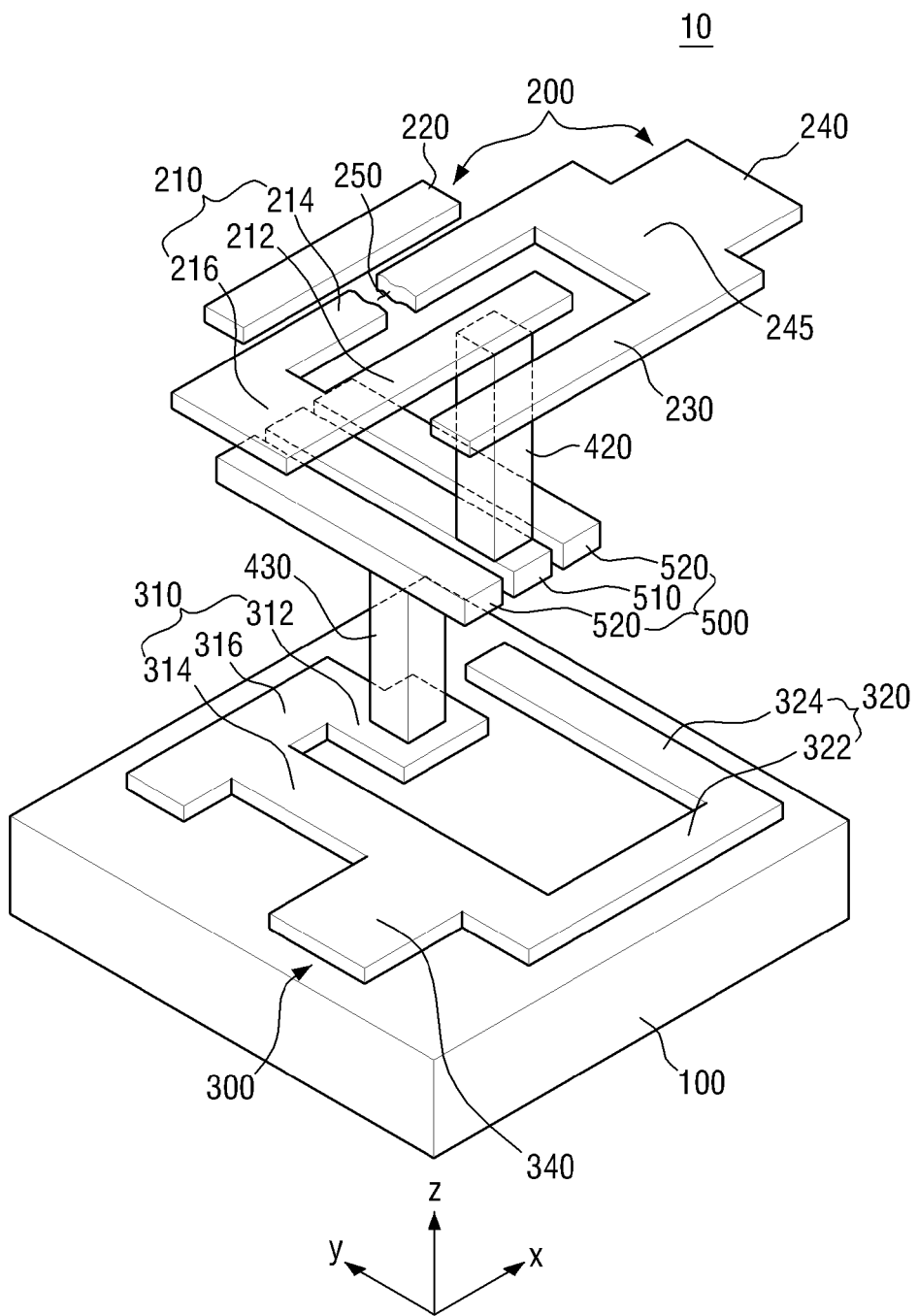
FIG. 32 illustrates that a void is created when a program current is supplied to e-fuse structures according to embodiments of the present invention.

FIG. 32 illustrates that a void is created when a program current is supplied to e-fuse structures according to certain embodiments of the present invention. For the sake of convenient explanation, the creation of void will be described with regard to a case where a program current is supplied to the e-fuse structure 10 according to the tenth embodiment of the present invention.

The supplying of the program current to the e-fuse structure 10 includes applying a positive voltage to the first power supply connection part 240 and applying a negative voltage to the second power supply connection part 340.

When the program current is supplied to the e-fuse structures 1-14 according to the embodiments of the present invention, the width W1 of the second part 214 of the first bent portion 210 is smallest, so that the current density is highest at the second part 214 of the first bent portion 210. Thus, a driving force derived from electromigration can be maximized at the second part 214 of the first bent portion 210. In addition, since the width W2 of the third part 216 of the first bent portion 210 connected to the second part 214 of the first bent portion 210 is greater than the width W1 of the second part 214 of the first bent portion 210, current integration may be facilitated at the second part 214 of the first bent portion 210.

In addition, when the program current is supplied to the e-fuse structures 1-14 according to the embodiments of the present invention, the second via 420 of each of the e-fuse structures may be a point at which the temperature is highest.

Referring to FIGS. 1 to 3, when the program current is supplied to the e-fuse structure, programming of the e-fuse structure occurs between a point at which the temperature is highest and the anode A. Therefore, the programming of the e-fuse structure may occur at the first bent portion 210. In addition, the programming point may not be the point of the e-fuse structure, where the temperature is highest, but may be around a point at which a temperature variation is severest in the e-fuse structure (that is, a point having the highest differential value of a temperature distribution), which is because the driving force derived from thermomigration becomes maximized at the point of the e-fuse structure where a severest temperature variation is demonstrated. Therefore, the driving force derived from thermomigration may be not applied to the first part 212 of the first bent portion 210 connected to the second via 420 having the highest temperature, but be applied to the second part 214 and the third part 216 of the first bent portion 210.

A sum of the driving force derived from electromigration and the driving force derived from thermomigration is a total driving force applied to the e-fuse structure. Therefore, from the viewpoint of total driving force, the total driving force supplied from the second part 214 of the first bent portion 210 to the e-fuse structure may become maximized. As such, when a program current is supplied to the e-fuse structure, a void 250 is formed at the second part 214 of the first bent portion 210, thereby programming the e-fuse structure.

Figure 33:
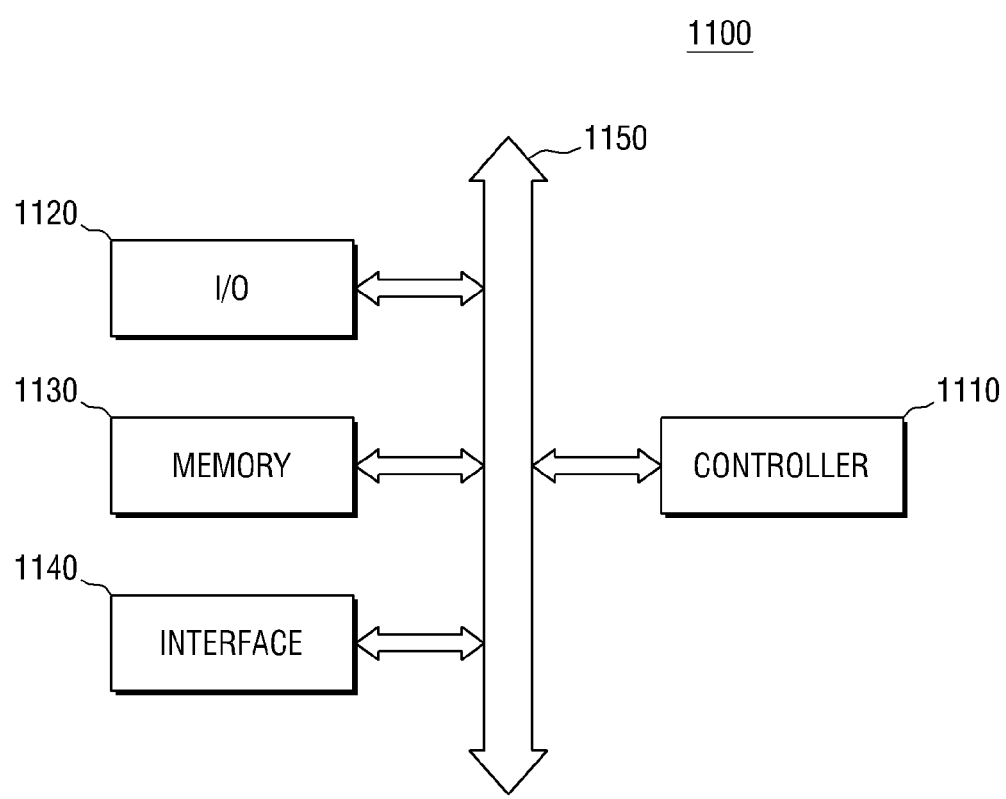
FIG. 33 is a schematic block diagram illustrating an exemplary memory system including semiconductor devices according to embodiments of the present invention.

FIG. 33 is a schematic block diagram illustrating an exemplary memory system including semiconductor devices according to embodiments of the present invention.

Referring to FIG. 33, memory system 1100 may be applied to an electronic device such as a personal digital assistant (PDA), a portable computer, a web tablet, a wireless phone, a mobile phone, a digital music player, a memory card, or any device capable of transmitting and receiving information in wireless circumstances.

The memory system 1100 includes a controller 1110, an input/output device (I/O) 1120, such as a keypad, a keyboard, or a display, a memory 1130, an interface 1140, and a bus 1150. The memory 1130 and the interface 1140 communicate with each other through the bus 1150.

The controller 1110 may include at least one of a microprocessor, a digital signal processor, a microcontroller, and logic elements capable of functions similar to those of these elements. The memory 1130 may be used to store commands executed by the controller 1110. The I/O 1120 may receive data or signals from the outside of the memory system 1100 or may output data or signals to the outside of the memory system 1100. The I/O 1120 may include, for example, a keypad, a keyboard, a display device, and so on. The memory 1130 includes a non-volatile memory. The memory 1130 may further include another kind of memory, an arbitrary accessible volatile memory, and other kinds of memories. The various e-fuses described above may be used, for example, in the memory 1130.

The interface 1140 may perform functions of transmitting data to a communication network or receiving data from the communication network.

Figure 34:
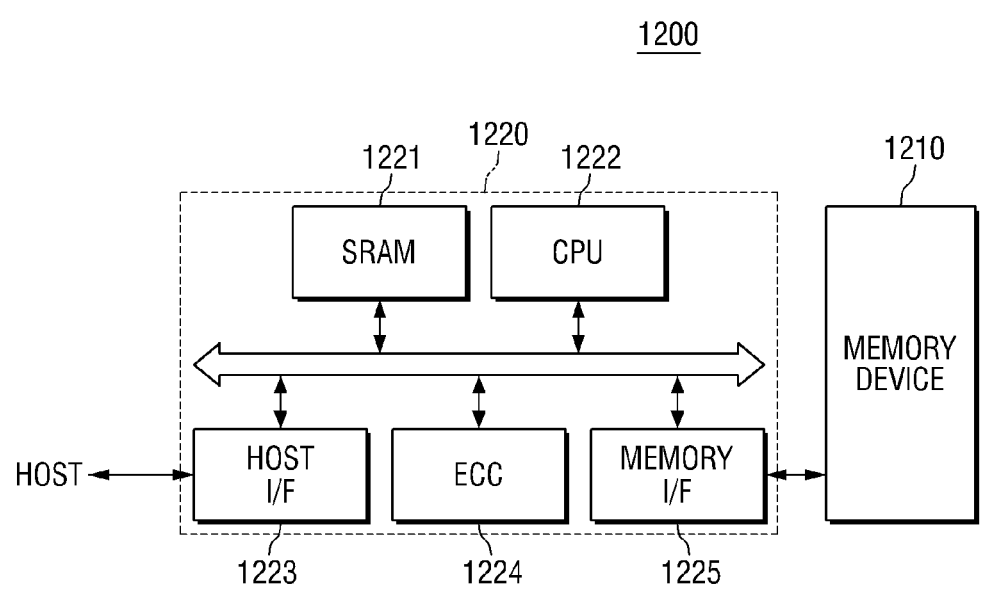
FIG. 34 is a schematic block diagram illustrating an exemplary memory card including semiconductor devices according to embodiments of the present invention.

FIG. 34 is a schematic block diagram illustrating an exemplary memory card including semiconductor devices according to embodiments of the present invention.

Referring to FIG. 34, the memory card 1200 for supporting high-capacity data storage includes a flash memory 1210 according to one or more embodiments of the present invention. The memory card 1200 according to one embodiment includes a memory controller 1220 controlling data exchange between a host and the flash memory 1210.

A static random access memory (SRAM) 1221 may operate as a working memory of the processing unit 1222. The host interface 1223 includes a data exchange protocol of the host connected to the memory card 1200. An error code correction block (ECC) 1224 may be configured to detect errors of the data read from the multi-bit flash memory 1210.

A central processing unit (CPU) 1222 performs the overall controlling operation for data exchange of the memory controller 1220. Although not shown, the memory card 1200 according to the present embodiment may further include a read only memory (ROM) storing code data for interfacing with the host. In one embodiment, the memory card 1200 includes one or more semiconductor devices (e.g., chips, packages, etc.) including one or more e-fuses in accordance with the various embodiments described above.

Figure 35:
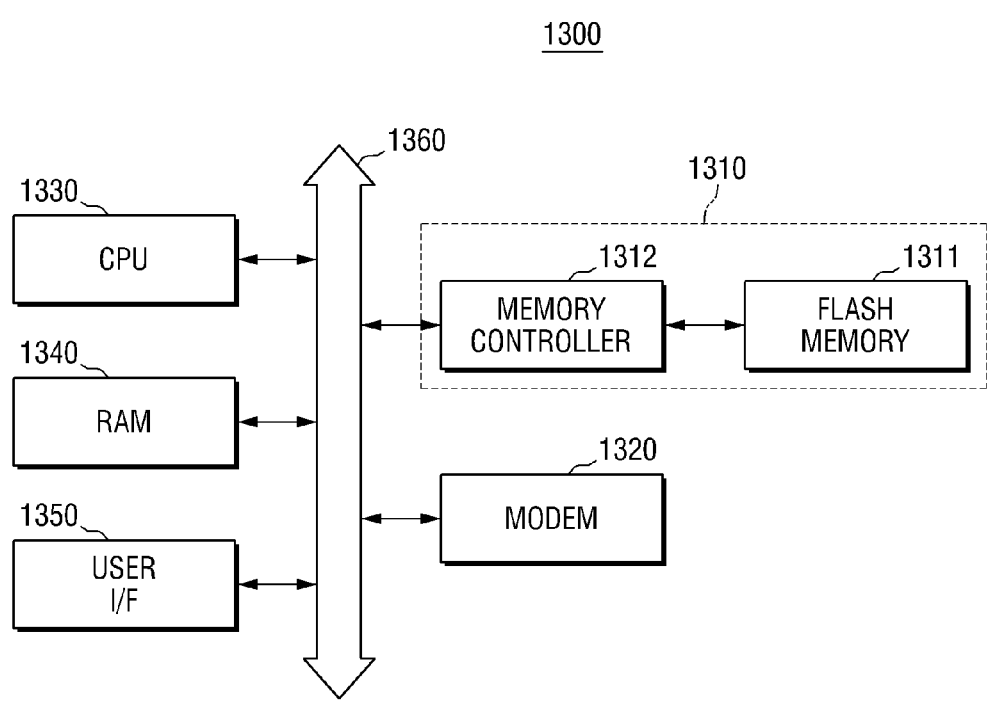
FIG. 35 is a schematic block diagram illustrating an exemplary information processing system in which semiconductor devices according to embodiments of the present invention are mounted.

FIG. 35 is a schematic block diagram illustrating an exemplary information processing system in which semiconductor devices according to embodiments of the present invention are mounted.

Referring to FIG. 35, the memory system 1310 according to certain embodiments is mounted on an information processing system, such as a mobile device or a desk-top computer. The information processing system 1300 according to the certain embodiments includes a modem 1320 electrically connected to the memory system 1310 and a system bus 1360, a central processing unit (CPU) 1330, a random access memory (RAM) 1340, and a user interface (I/F) 1350. The memory system 1310 may be configured in substantially the same manner as the aforementioned memory system. The memory system 1310 stores data processed by the CPU 1330 or externally input data. The memory system 1310 may be constituted by a solid state drive (SSD). In this case, the information processing system 1300 may stably store large-capacity data in the memory system 1310. Along with the increase in the reliability, the memory system 1310 may save resources required in error correction, thereby providing a high-speed data exchange function to the information processing system 1300. The memory system 1310 may include one or more semiconductor devices (e.g., chips, packages, etc.) that include one or more e-fuses such as described in the above embodiments. Although not shown, the information processing system 1300 according to the certain embodiments may further include an application chipset, a camera image processor (CIS), an I/O device, and so on.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device including an e-fuse structure, comprising:
   a substrate;
   a first metal pattern formed at a first vertical level above the substrate;
   a second metal pattern formed at a second vertical level above the substrate closer to the substrate than the first vertical level; and
   a conductive via structure physically and electrically connecting the first metal pattern to the second metal pattern,
   wherein the first metal pattern includes a first part extending in a first direction, a second part extending in the first direction and adjacent to the first part, a third part electrically and physically connecting the first part to the second part, and a fourth part extending in the first direction and adjacent to the second part but not electrically connected to the first, second, or third parts,
   wherein the second part is between the first part and the fourth part.

2. The semiconductor device of claim 1, wherein the first part, second part, and fourth part are all substantially parallel to each other.

3. The semiconductor device of claim 1, wherein the conductive via structure directly connects the first part to the second metal pattern.

4. The semiconductor device of claim 1, wherein the second part is configured to break before the first part.

5. The semiconductor device of claim 1, wherein the first metal pattern is connected to a cathode of the e-fuse structure, and the second metal pattern is connected to an anode of the e-fuse structure.

6. The semiconductor device of claim 1, wherein the first part, second part, third part, and fourth part are all integrally formed at the first level.

7. The semiconductor device of claim 4, wherein the second part has a smaller width in a direction perpendicular to the first direction than the first part.

8. An e-fuse structure of a semiconductor device, the e-fuse structure comprising:
   a first metal pattern formed at a first vertical level, the first metal pattern including a first part extending in a first direction and a second part extending in the first direction and positioned to be adjacent to the first part, and a third part adjacent to the second part, the second part being positioned between the first part and the third part, the first part and the second part being electrically connected to each other, and the third part being electrically disconnected from the second part; and
   a second metal pattern electrically connected to the first metal pattern and formed at a second vertical level different from the first vertical level.

9. The e-fuse structure of claim 8, wherein the first metal pattern includes a fourth part physically and electrically connecting the first part to the second part.

10. The e-fuse structure of claim 8, wherein the first metal pattern includes a fourth part extending in the first direction and having a side surface facing a side surface of the second part, and
    wherein the first part is positioned between the second part and the fourth part.

11. The e-fuse structure of claim 8, further comprising a via connecting the first metal pattern to the second metal pattern,
wherein the second metal pattern includes a fourth part and a fifth part having side surfaces facing each other and positioned to be adjacent to each other and a sixth part connecting one end of the fourth part to one end of the fifth part, and
wherein the via directly connects the first part to the fourth part.

12. The e-fuse structure of claim 11, wherein a width of the fourth part is greater than that of the first part and the width of the first part is greater than that of the second part.

13. The e-fuse structure of claim 8, wherein the third part extends in the first direction.

14. The e-fuse structure of claim 8, wherein the first metal pattern and the second metal pattern are formed on a substrate, the first metal pattern is positioned at a first height from a top surface of the substrate, the second metal pattern is positioned at a second height from the top surface of the substrate, and the first height is greater than the second height.

15. The e-fuse structure of claim 9, wherein the first part, the fourth part and the second part sequentially connected to one another form a U-shape configuration.

16. The e-fuse structure of claim 10, wherein the first metal pattern includes a fifth part connecting the second part to the fourth part.

17. The e-fuse structure of claim 11, wherein the second metal pattern further includes a seventh part facing the sixth part with the fourth part and the fifth part positioned between the sixth part and the seventh part.

18. The e-fuse structure of claim 11, wherein the first metal pattern includes a first power supply connection part connected to the second part and the second metal pattern includes a second power supply connection part connected to the fifth part.

19. The e-fuse structure of claim 15, wherein a width of the fourth part between an inside side surface of the U-shape and an outside side surface of the U-shape is greater than a width of the first part between the inside side surface of the U-shape the outside side surface of the U-shape.

20. The e-fuse structure of claim 16, wherein the second part, the fifth part and the fourth part sequentially connected to one another form a U-shaped configuration.

21. The e-fuse structure of claim 16, wherein the first part, second part, third part, fourth part, and fifth part form an integrally formed spiral structure.

22. The e-fuse structure of claim 16, wherein the fourth part is not used as a path of current migration.

23. The e-fuse structure of claim 17, wherein the second metal pattern further includes an eighth part connected to the seventh part, and
wherein the seventh part and the eighth part connected to each other are L-shaped.

24. The e-fuse structure of claim 18, wherein the fifth part extends in a second direction different from the first direction, the sixth part extends in the first direction, and
wherein the first power supply connection part and the second power supply connection part are positioned at opposite sides of the first direction in view of the via.

25. The e-fuse structure of claim 19, wherein a width of the second part is a critical dimension L and the width of the fourth part is greater than L and smaller than or equal to 2L.

26. An e-fuse structure of a semiconductor device comprising:
a first metal pattern formed at a first vertical level and including a U-shaped first bent portion and a first auxiliary pattern electrically disconnected from the first bent portion, the first bent portion including a first part and a second part extending in a first direction and positioned to be adjacent to each other, with the second part positioned between the first auxiliary pattern and the first part;
a first via physically and electrically connected to the first part; and
a second metal pattern formed at a second vertical level different from the first vertical level and physically and electrically connected to the first via.

27. The e-fuse structure of claim 26, wherein the second metal pattern includes a second bent portion and a power supply connection part connected to the second bent portion, the second bent portion includes a fourth part extending in a second direction different from the first direction, a fifth part having a side surface facing a side surface of the fourth part and being adjacent to the fourth part, and a sixth part connecting one end of the fourth part to one end of the fifth part and extending in the first direction, and the power supply connection part connected to the fourth part.

28. The e-fuse structure of claim 26, further comprising:
a third metal pattern extending in a second direction different from the first direction and formed at a third vertical level between the first vertical level and the second vertical level; and
a second via connecting the third metal pattern to the second metal pattern,
wherein the first via connects the first metal pattern to the third metal pattern.

29. The e-fuse structure of claim 26, wherein the first metal pattern includes a second auxiliary pattern extending in the first direction with the first part positioned between the second auxiliary pattern and the second part.

30. The e-fuse structure of claim 29, wherein the second auxiliary pattern is connected to the second part and is not used as a path of a program current.

31. The e-fuse structure of claim 26, wherein the first auxiliary pattern extends in the first direction.

32. The e-fuse structure of claim 28, wherein the third metal pattern includes a connection pattern extending in the first direction and second auxiliary patterns formed at both sides of the connection pattern to be parallel with the connection pattern, and
wherein the first via and the second via are connected to the connection pattern.

33. The e-fuse structure of claim 27, wherein the first via is directly connected to the fifth part.

34. The e-fuse structure of claim 27, wherein the second metal pattern further includes a second auxiliary pattern that is not used as a path of current migration,
wherein the second auxiliary pattern includes a seventh part extending in the first direction and an eighth part extending from one end of the seventh part and extending in the second direction, and
wherein one end of the seventh part is connected to one end of the fourth part, and the fifth part is positioned between the seventh part and the sixth part.

* * * * *